United States Patent
Ouderkirk et al.

(10) Patent No.: US 9,159,885 B2
(45) Date of Patent: Oct. 13, 2015

(54) REMOTE PHOSPHOR LED DEVICE WITH BROADBAND OUTPUT AND CONTROLLABLE COLOR

(75) Inventors: Andrew J. Ouderkirk, St. Paul, MN (US); Arokiaraj Jesudoss, Singapore (SG); Ravi Palaniswamy, Singapore (SG); Nicholas T. Gabriel, Minneapolis, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 263 days.

(21) Appl. No.: 13/991,062

(22) PCT Filed: Dec. 19, 2011

(86) PCT No.: PCT/US2011/165780
§ 371 (c)(1),
(2), (4) Date: May 31, 2013

(87) PCT Pub. No.: WO2012/091973
PCT Pub. Date: Jul. 5, 2012

(65) Prior Publication Data
US 2013/0264947 A1 Oct. 10, 2013

Related U.S. Application Data

(60) Provisional application No. 61/428,034, filed on Dec. 29, 2010, provisional application No. 61/487,423, filed on May 18, 2011.

(51) Int. Cl.
*H01L 33/50* (2010.01)
*H01L 25/075* (2006.01)
(Continued)

(52) U.S. Cl.
CPC . *H01L 33/50* (2013.01); *F21K 9/56* (2013.01); *F21V 9/16* (2013.01); *H01L 25/0753* (2013.01);
(Continued)

(58) Field of Classification Search
CPC ....... H05B 33/0869; H01L 33/50; F21K 9/56; F21Y 2113/005
USPC ........................................ 315/151
See application file for complete search history.

(56) References Cited

U.S. PATENT DOCUMENTS 5,861,717 A 1/1999 Begemann
(Continued)

FOREIGN PATENT DOCUMENTS

| CN | 101346818 A | 1/2009 |
|---|---|---|
| DE | 102007037875 | 2/2009 |

(Continued)

OTHER PUBLICATIONS

International Search Report for PCT International Application No. PCT/US2011/065780, mailed on Apr. 4, 2012, 4 pages.
(Continued)

*Primary Examiner* — Hai L Nguyen
(74) *Attorney, Agent, or Firm* — Gregg H. Rosenblatt

(57) ABSTRACT

A broadband light source includes a phosphor layer excited by light from multiple LEDs. A dichroic reflector reflects light from the LEDs onto the phosphor layer. First and second LEDs are responsible for first and second broadband portions respectively of a broadband output light of the source, each such broadband portion being broadband and nominally white. The device components are configured and arranged so that the first and second broadband light portions have different CIE color coordinates. These portions combine to yield a resultant color for the overall broadband light output of the source, which resultant color is a function of the relative amounts of the first and second broadband light portions. An open-loop or closed-loop controller can independently drive the LEDs to provide a desired mix of the broadband light portions so that the overall broadband light output has a color in a desired design space.

15 Claims, 22 Drawing Sheets

(51) Int. Cl.
 H05B 33/08 (2006.01)
 F21K 99/00 (2010.01)
 F21V 9/16 (2006.01)
 H01L 33/60 (2010.01)
 F21Y 101/02 (2006.01)
 F21Y 113/00 (2006.01)

(52) U.S. Cl.
 CPC .......... H01L 33/507 (2013.01); H05B 33/0869 (2013.01); F21Y 2101/02 (2013.01); F21Y 2113/005 (2013.01); H01L 33/60 (2013.01); H01L 2924/0002 (2013.01)

(56) References Cited

U.S. PATENT DOCUMENTS

| | | | |
|---|---|---|---|
| 5,882,774 | A | 3/1999 | Jonza |
| 6,016,038 | A | 1/2000 | Mueller |
| 6,636,003 | B2 | 10/2003 | Rahm |
| 6,783,349 | B2 | 8/2004 | Neavin |
| 6,967,778 | B1 | 11/2005 | Wheatley |
| 7,091,653 | B2 | 8/2006 | Ouderkirk |
| 7,288,902 | B1 | 10/2007 | Melanson |
| 7,330,314 | B1 | 2/2008 | Cobb |
| 7,358,679 | B2 | 4/2008 | Lys |
| 7,387,405 | B2 | 6/2008 | Ducharme |
| 7,621,677 | B2 | 11/2009 | Yang |
| 8,912,562 | B2 * | 12/2014 | Ouderkirk et al. .............. 257/98 |
| 2005/0270775 | A1 | 12/2005 | Harbers |
| 2007/0001182 | A1 | 1/2007 | Schardt et al. |
| 2007/0024191 | A1 | 2/2007 | Chen et al. |
| 2009/0052833 | A1 | 2/2009 | Yang |
| 2009/0114929 | A1 | 5/2009 | Lee |
| 2011/0012147 | A1 | 1/2011 | Bierhuizen |
| 2011/0272713 | A1 | 11/2011 | Wirth |
| 2013/0270587 | A1 | 10/2013 | Ouderkirk et al. |

FOREIGN PATENT DOCUMENTS

| | | |
|---|---|---|
| DE | 102007059548 | 4/2009 |
| TW | 200921952 A | 5/2009 |
| WO | WO 2008-106067 | 9/2008 |
| WO | WO 2010-128438 | 11/2010 |
| WO | WO 2011-002686 | 1/2011 |
| WO | WO 2012-091971 | 7/2012 |
| WO | WO 2012-091972 | 7/2012 |
| WO | WO 2012-091975 | 7/2012 |

OTHER PUBLICATIONS

Office Action, and translation thereof, from counterpart Chinese Application No. 201180063687.8, dated Jun. 16, 2015, 7 pp.

* cited by examiner

REMOTE PHOSPHOR LED DEVICE WITH BROADBAND OUTPUT AND CONTROLLABLE COLOR

FIELD OF THE INVENTION

This invention relates generally to light sources, with particular application to solid state light sources that incorporate a light emitting diode (LED) and a phosphor. The invention also relates to associated articles, systems, and methods.

BACKGROUND

Solid state light sources that emit broadband light are known. In some cases, such light sources are made by applying a layer of yellow-emitting phosphor onto a blue LED. As light from the blue LED passes through the phosphor layer, some of the blue light is absorbed, and a substantial portion of the absorbed energy is re-emitted by the phosphor as Stokes-shifted light at longer wavelengths in the visible spectrum, typically, yellow light. The phosphor thickness is small enough so that some of the blue LED light passes all the way through the phosphor layer, and combines with the yellow light from the phosphor to provide broadband output light having a white appearance.

Other LED-pumped phosphor light sources have also been proposed. In U.S. Pat. No. 7,091,653, a light source is discussed in which ultraviolet (UV) light from an LED is reflected by a long-pass reflector onto a phosphor layer. The phosphor layer emits visible (preferably white) light, which light is substantially transmitted by the long-pass reflector. The LED, phosphor layer, and long-pass filter are arranged in such a way that as UV light travels from the LED to the long-pass reflector it does not pass through the phosphor layer.

BRIEF SUMMARY

We have developed a new family of broadband solid state light sources. These light sources utilize a phosphor layer or material that is pumped or excited by light from at least two LEDs. The sources also include a dichroic reflector that reflects at least some of the light from the LEDs onto the phosphor layer. As light propagates from the LEDs to the dichroic reflector, it does not pass through the phosphor layer. The first and second LEDs are responsible for first and second portions respectively of a broadband light output of the source. Each of the first and second broadband light portions is also broadband, and each such portion is preferably nominally white.

The first portion may, for example, be composed of some light from the first LED that is transmitted by the dichroic reflector, and some phosphor light that results from other light from the first LED that is reflected by the dichroic reflector onto a first portion of the phosphor layer to excite such phosphor layer portion. The second portion of the broadband light output may similarly be composed of some light from the second LED that is transmitted by the dichroic reflector, and some phosphor light that results from other light from the second LED that is reflected by the dichroic reflector onto a second portion of the phosphor layer to excite such phosphor layer portion. In alternative embodiments, the dichroic reflector may be configured to transmit little or none of the first and second LED light, in which case the first and second portions of the broadband light output may include little or no LED light, and may instead include only phosphor light from the different excited portions of the phosphor layer.

In any case, although each of the first and second broadband light portions is broadband and nominally white, the LEDs, the dichroic reflector, and the phosphor layer are configured and arranged such that the first broadband light portion has a color that is different from that of the second broadband light portion. The different colors of the first and second portions, which may for example be represented by different points on a CIE chromaticity graph, then combine to yield a resultant color for the overall broadband light output of the source, which resultant color is a function of the relative proportion or relative amounts of the first and second broadband light portions. If desired, a controller can be used to independently drive or energize the LEDs to provide a desired mix of the first and second broadband light portions so that the overall broadband light output of the source has a color in a desired design space. The controller can operate in an open-loop configuration with no feedback, or it can operate in a closed-loop configuration with feedback from one or more detectors. The different colors of the first and second broadband light portions, and of the overall broadband output of the source, may be represented by different respective color temperatures and/or correlated color temperatures.

We describe herein, among other things, light sources for emitting broadband output light. Such light sources may include a first and second LED, a layer of phosphor material, and a dichroic reflector. The first and second LEDs are adapted to emit first and second LED light respectively. The layer of phosphor material is adapted to emit first longer wavelength phosphor light in response to excitation from light emitted by the first LED, and second longer wavelength phosphor light in response to excitation from light emitted by the second LED. The dichroic reflector is configured to reflect at least a portion of the first LED light, and at least a portion of the second LED light, onto the layer of phosphor material in such a way that as light propagates from the first and second LEDs to the dichroic reflector, it does not pass through the layer of phosphor material. Further, the dichroic reflector substantially transmits light at the first and second longer wavelengths so that such transmitted first and second longer wavelength light is included in the broadband output light of the light source. The first longer wavelength phosphor light, and optionally a remaining portion of the first LED light, provide a first broadband light portion for the light source. The second longer wavelength phosphor light, and optionally a remaining portion of the second LED light, provide a second broadband light portion for the light source. The first and second broadband light portions are included in the broadband output light of the light source. The first broadband light portion has a first color, and the second broadband light portion has a second color that differs from the first color.

The first and second LEDs may be disposed proximate a structure or medium that has a concave surface, and the dichroic reflector may be disposed on the concave surface. In some cases, the first and second LEDs may be immersed in the medium. Furthermore, the concave surface may be curved, and a reflection spectrum of the dichroic reflector may change as a function of incidence angle of incident light.

The first LED may be one of a first group of LEDs, the LEDs in the first group providing, with longer wavelength phosphor light excited by such LEDs, first portions of the broadband output light of the light source, the first portions all having the first color. Furthermore, the dichroic reflector may have an optical axis, and the LEDs in the first group may each be disposed at a same first distance from the optical axis. The second LED may likewise be one of a second group of LEDs, the LEDs in the second group providing, with longer wavelength phosphor light excited by such LEDs, second portions of the broadband output light of the light source, the second portions all having the second color. The LEDs in the second group may each be disposed at a same second distance from the optical axis, the second distance being different from the first distance.

The dichroic reflector may in some cases reflect substantially all of the first and second LED light, such that the broadband output light of the light source includes substantially none of the first and second LED light. The layer of phosphor material may include a first phosphor layer portion and a second phosphor layer portion, the dichroic reflector configured to reflect at least a portion of the first LED light onto the first phosphor layer portion and to reflect at least a portion of the second LED light onto the second phosphor layer portion, and the first and second phosphor layer portions may have different phosphor compositions. Additionally, the first and second phosphor layer portions may emit phosphor light with differing spectral distributions when illuminated with the reflected light from the first and second LEDs respectively.

The dichroic reflector may in other cases reflect only a portion of the first and second LED light, and transmit the remaining portions of the first and second LED light, such that the broadband output light of the light source includes the remaining portions of the first and second LED light. The dichroic reflector may have a concave shape and an optical axis, and the first and second LEDs may be positioned at different radial distances from the optical axis. The dichroic reflector may be configured, and the first and second LEDs may be positioned, such that a first light ray emitted by the first LED and a second light ray emitted by the second LED in a direction parallel to the first light ray impinge upon the dichroic reflector at different angles of incidence. The first LED light may impinge on the dichroic reflector over a first range of incidence angles, the dichroic reflector may have a first transmission spectrum having a first band edge characterized by a transition from low to high transmission over a spectral transition region, such first transmission spectrum corresponding to a first incidence angle that is disposed within the first range of incidence angles, and the first LED light may have a first spectral distribution that at least overlaps with the first band edge. The second LED light may similarly impinge on the dichroic reflector over a second range of incidence angles, the dichroic reflector may have a second transmission spectrum having a second band edge characterized by a transition from low to high transmission over a spectral transition region, such second transmission spectrum corresponding to a second incidence angle that is disposed within the second range of incidence angles, and the second LED light may have a second spectral distribution that at least overlaps with the second band edge. The low and high transmissions may correspond to 10% and 90%, respectively, or 5% and 95%, of a maximum transmission of the dichroic reflector.

The first and second LED lights may have nominally the same spectral distribution. For example, the first and second LED lights may have respective first and second peak wavelengths that differ by no more than 100, or 60, or 30, or 20, or 10 nm.

The first and second LEDs may be members of a first plurality of neighboring LEDs that are disposed in a first wedge-shaped region. The source may also include a second plurality of neighboring LEDs disposed in a second wedge-shaped region, the first and second wedge-shaped regions being separated from each other by an unobstructed portion of the layer of phosphor material. The source may further include a third plurality of neighboring LEDs disposed in a third wedge-shaped region separated from the first and second wedge-shaped regions, and the third plurality of neighboring LEDs may be disposed such that at least a portion of LED light from the third plurality of neighboring LEDs is reflected by the dichroic reflector onto the unobstructed portion of the layer of phosphor material.

The source may also include a controller configured to drive the first and second LEDs independently to control a color of the broadband output light. The source may further include one or more detectors positioned to receive at least a portion of at least one of the first LED light, the second LED light, the first longer wavelength phosphor light, and the second longer wavelength phosphor light. The one or more detectors may have one or more detector outputs respectively coupled to the controller, and the controller may be configured to drive the first and second LEDs as a function of the one or more detector outputs. The one or more detectors may include a first detector having a first spectral response, and a second detector having a second spectral response different from the first spectral response, such that detector outputs of the first and second detectors can provide in combination an indication of color. In some cases, the one or more detectors may include a component that alternately detects and emits light.

We also disclose light sources for emitting broadband output light that include a plurality of neighboring LEDs, a light-transmissive structure in which the plurality of LEDs are encapsulated, a layer of phosphor material, and a dichroic reflector. The plurality of neighboring LEDs include a first and second LED adapted to emit first and second LED light, respectively. The light-transmissive structure has a curved concave surface. The layer of phosphor material is adapted to emit first longer wavelength phosphor light in response to excitation from light emitted by the first LED and second longer wavelength phosphor light in response to excitation from light emitted by the second LED. The dichroic reflector covers the curved concave surface, and is configured to reflect at least a portion of the first LED light, and at least a portion of the second LED light, onto the layer of phosphor material in such a way that as light propagates from the first and second LEDs to the dichroic reflector it does not pass through the layer of phosphor material. The dichroic reflector also substantially transmits light at the first and second longer wavelengths so that such transmitted first and second longer wavelength phosphor light is included in the broadband output light of the light source. The dichroic reflector also has or defines an optical axis, and the first and second LEDs are disposed at different radial distances from the optical axis. The first longer wavelength phosphor light and optionally a remaining portion of the first LED light provide a first broadband light portion for the light source, and the second longer wavelength phosphor light and optionally a remaining portion of the second LED light provide a second broadband light portion for the light source, the broadband output light of the light source comprising the first and second broadband light portions. The first broadband light portion has a first color, and the second broadband light portion has a second color that differs from the first color. The first and second broadband light portions may also have different color temperatures and/or different correlated color temperatures. In some cases, the first and second LED lights may have respective first and second peak wavelengths that differ by no more than 100, or 60, or 30, or 20, or 10 nm.

Related methods, systems, and articles are also discussed.

These and other aspects of the present application will be apparent from the detailed description below. In no event, however, should the above summaries be construed as limi-

BRIEF DESCRIPTION OF THE DRAWINGS

In the figures, like reference numerals designate like elements.

DETAILED DESCRIPTION OF ILLUSTRATIVE EMBODIMENTS

Figure 1:
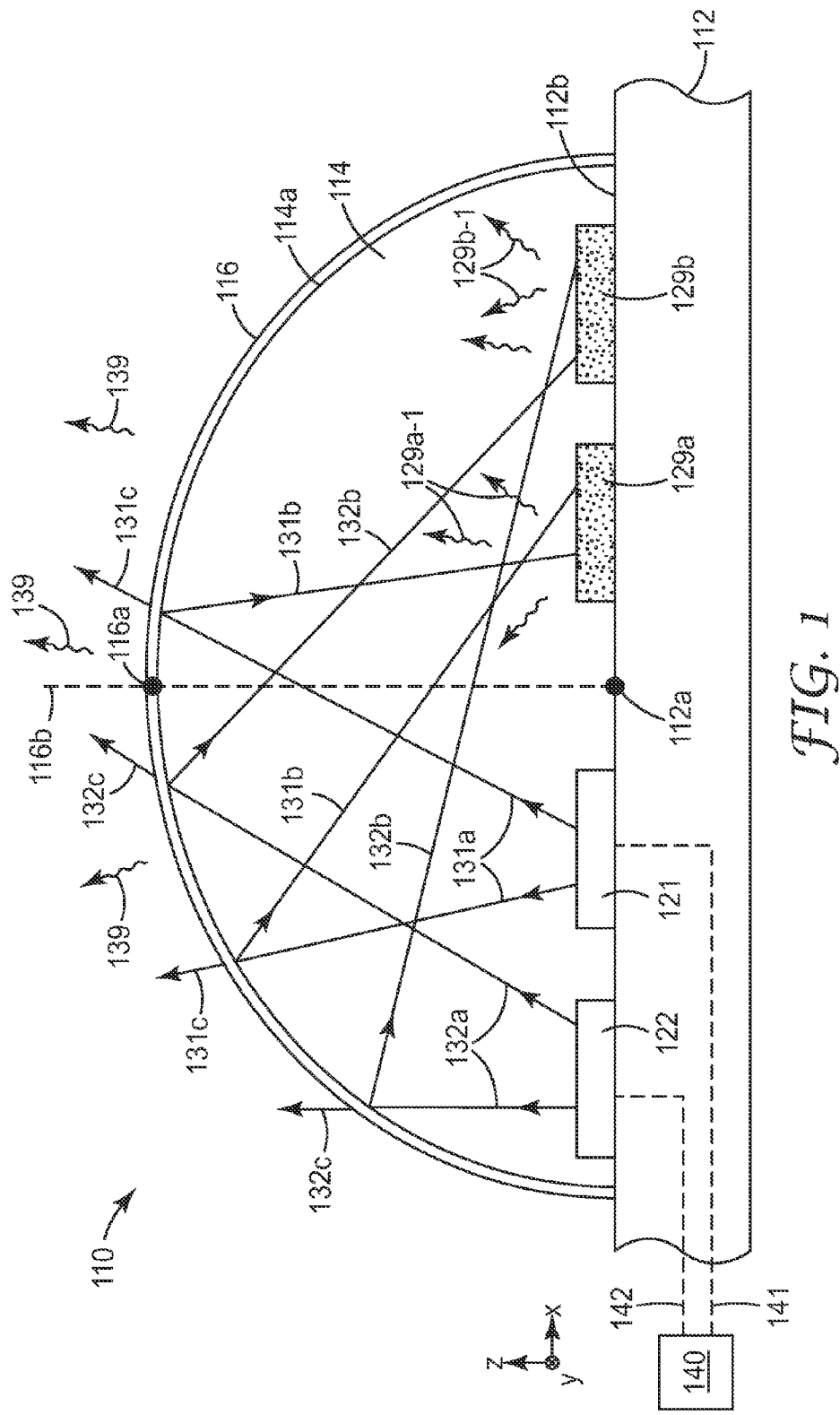
FIG. 1 is a schematic side or sectional view of an exemplary broadband light source.

As mentioned above, the present application describes, among other things, broadband solid state light sources that utilize a phosphor layer or material that is pumped or excited by light from at least two LEDs. The sources also include a dichroic reflector that reflects at least some of the light from the LEDs onto the phosphor layer. As light propagates from the LEDs to the dichroic reflector, it does not pass through the phosphor layer. The first and second LEDs are responsible for first and second portions respectively of a broadband light output of the source. Each of the first and second broadband light portions is also broadband, and each such portion is preferably nominally white. The LEDs, the dichroic reflector, and the phosphor layer are configured and arranged such that the first broadband light portion has a color that is different from that of the second broadband light portion. The different colors of the first and second portions combine to yield a resultant color for the overall broadband light output of the source, which resultant color is a function of the relative proportion or relative amounts of the first and second broadband light portions.

In this regard, "light emitting diode" or "LED" refers to a diode that emits light, whether visible, ultraviolet, or infrared, although in most practical embodiments the emitted light will have a peak wavelength in a range from about 430 to 530 nm, or from about 440 to 500 nm, or from about 445 to 480 nm. The term LED includes incoherent encased or encapsulated semiconductor devices marketed as "LEDs", whether of the conventional or super radiant variety. An "LED die" is an LED in its most basic form, i.e., in the form of an individual component or chip made by semiconductor processing procedures. For example, the LED die may be formed from a combination of one or more Group III elements and of one or more Group V elements (III-V semiconductor). Examples of suitable III-V semiconductor materials include nitrides, such as gallium nitride, and phosphides, such as indium gallium phosphide. Other types of III-V materials can also be used, as well as inorganic materials from other groups of the periodic table. The component or chip can include electrical contacts suitable for application of power to energize the device. Examples include wire bonding, tape automated bonding (TAB), or flip-chip bonding. The individual layers and other functional elements of the component or chip are typically formed on the wafer scale, and the finished wafer can then be diced into individual piece parts to yield a multiplicity of LED dies. The LED die may be configured for surface mount, chip-on-board, or other known mounting configurations. Some packaged LEDs are made by forming a polymer encapsulant over an LED die and an associated reflector cup. The LED may be grown on one of several substrates. For example, GaN LEDs may be grown by epitaxy on sapphire, silicon, and gallium nitride. An "LED" for purposes of this application should also be considered to include organic light emitting diodes, commonly referred to as OLEDs.

In FIG. 1, we see a schematic side or sectional view of an exemplary broadband light source 110. A substrate 112 of the source 110 carries LEDs 121, 122, a layer of phosphor material (which is made up of a first phosphor body 129a and a second phosphor body 129b), and a dichroic reflector 116. The LEDs typically emit light of a relatively short wavelength, e.g., primarily ultraviolet light or blue light, although in some cases blue-green or green light may also be used. The LEDs may emit such light in all directions from their exposed outer surfaces, and this light propagates through a bounded space 114 before it impinges upon the dichroic reflector 116. The dichroic reflector 116 reflects at least some, and in some cases substantially all, of this LED light. Any LED light impinging on the dichroic reflector 116 that is not reflected is typically not absorbed, but instead transmitted, by the dichroic reflector.

Dichroic reflectors, also sometimes referred to as dichroic mirrors or dichroic filters, are reflectors designed to have a high reflectivity and low transmission for some optical wavelengths, and a low reflectivity and high transmission for other optical wavelengths. Such reflectors ordinarily have negligible absorption, such that any light that is not reflected is substantially transmitted, and vice versa, at least over visible, near infrared, and near-ultraviolet wavelengths. Such reflectors comprise stacks of optically thin microlayers, typically in an alternating arrangement of materials having a large refractive index mismatch, such as alternating layers of silicon dioxide and titanium dioxide, but other suitable inorganic or organic materials may also be used. Such reflectors may be made by vacuum deposition of the alternating layers on a glass or other suitable substrate. Alternatively, suitable reflective films may be made by a continuous process that may involve coextrusion of alternating polymer materials and stretching the resulting multilayer polymer web, e.g. as described in U.S. Pat. Nos. 5,882,774 and 6,783,349. Regardless of the materials used in the dichroic reflector and the method of manufacture used, the reflector is provided with a layer thickness profile for the stack of microlayers that is tailored to provide the desired reflection characteristics as a function of wavelength, as described elsewhere herein. Reference in this regard is made to U.S. Pat. No. 6,967,778. The thickness profile may be tailored to provide a dichroic reflector that operates as a long pass filter or a notch filter, for example. In some cases the dichroic reflector may be or comprise a multilayer mirror film, a reflective polarizer, and/or a partially polarizing reflector such as a mirror that, at a given wavelength, reflects orthogonal polarization states differently.

The dichroic reflector 116 may be tailored to reflect at least a portion of the light emitted by the LED 121, and transmit a remaining portion of such LED 121 light unless the reflection is at or near 100%. The dichroic reflector 116 may also reflect at least a portion of the light emitted by the other LED 122, and transmit a remaining portion of such LED 122 light unless the reflection of the LED 122 light is at or near 100%. (In some cases, the dichroic reflector may reflect substantially all the light from one LED, such as LED 121, and transmit a portion of the light from another LED, such as LED 122, even in cases where such LEDs have the same emission spectrum.) The reflector 116 preferably has a concave shape, so that light emitted by a given one of the LEDs, and reflected by the reflector 116, is directed onto a localized portion of the phosphor layer, such as a given one of the phosphor bodies 129a, 129b. In exemplary embodiments, the reflector 116 may have a hemispherical shape, or partially spherical shape, or other curved shape such as an aspherical shape, and the LED and phosphor layer may be positioned relative to such a reflector so that light from the LED that is reflected by the dichroic reflector produces an image, spot, or similar localized area of increased intensity on the phosphor layer. For example, if the dichroic reflector 116 of FIG. 1 is nominally hemispherical with a center of curvature at or near the point 112a which is disposed at or near an upper surface 112b of substrate 112, and if the LEDs 121, 122 and phosphor bodies 129a, 129b are relatively low profile such that their relevant outer surfaces are sufficiently close to the surface 112b, then the dichroic reflector may form an image or the like of the LED 121 on the phosphor body 129a, and may also form an image or the like of the LED 122 on the phosphor body 129b.

In this regard, FIG. 1 depicts LED 121 emitting light rays 131a, representative of light being emitted by the LED in all directions. These rays pass through the bounded space 114 (without passing through the phosphor layer), and strike the concave, curved dichroic reflector 116. At least a portion of these rays are reflected by the reflector 116 as rays 131b. In some cases, a remaining portion of the original rays 131a are transmitted by the reflector 116 as rays 131c. The reflected rays 131b are preferentially directed onto the phosphor body 129a more than phosphor body 129b, thus providing at least a crude image of the LED 121 on the phosphor body 129a. Similarly, LED 122 is depicted emitting light rays 132a, again representative of light being emitted by the LED in all directions. These rays pass through the bounded space 114 and strike the concave, curved dichroic reflector 116. At least a portion of these rays are reflected by the reflector 116 as rays 132b; in some cases, a remaining portion of the original rays 132a are transmitted by the reflector 116 as rays 132c. The reflected rays 132b are preferentially directed onto the phosphor body 129b more than phosphor body 129a, thus providing at least a crude image of the LED 122 on the phosphor body 129b.

Figure 2A:
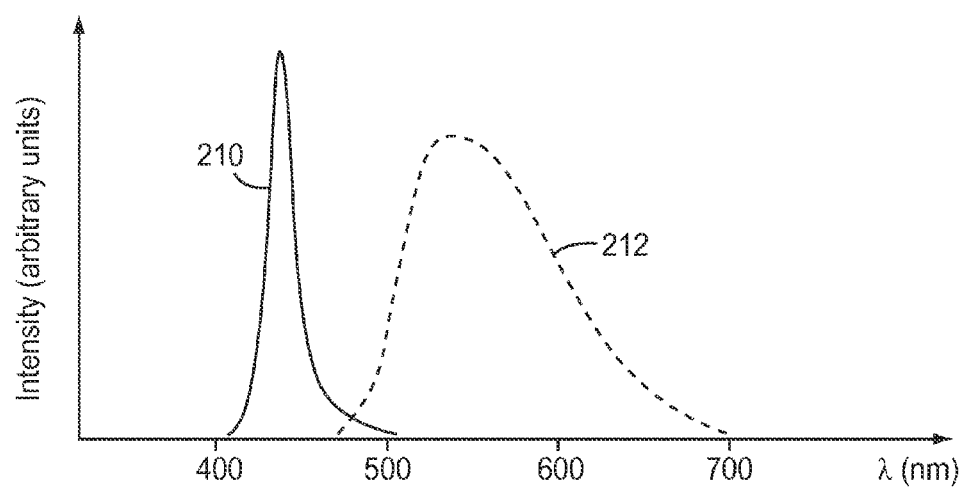
FIG. 2a is an idealized graph of the spectral intensity distributions of an exemplary blue LED and an exemplary phosphor.

The light emitted by LED 121, and reflected by the dichroic reflector, has a spectral distribution that excites the phosphor body 129a, causing that body to emit phosphor light 129a-1. This phosphor light is typically emitted in all directions. Likewise, the light emitted by LED 122, and reflected by the dichroic reflector, has a spectral distribution that excites the phosphor body 129b, causing that body to emit phosphor light 129b-1, again typically in all directions. The phosphor light 129a-1, 129b-1 is substantially transmitted by the dichroic reflector 116. The reflector may for example transmit at least 50%, or at least 60%, or at least 70% or more of each of phosphor lights 129a-1 and 129b-1, such transmitted phosphor light being collectively depicted in FIG. 1 as transmitted phosphor light 139, which contributes to the overall broadband output of the source 110. The light emitted by each of the phosphors is typically broadband, e.g., each may emit light over a spectral width of at least 100 nanometers. This broadband light may be distributed in a continuous broad band, such as the one depicted by curve 212 in FIG. 2a, or it may have a spiked distribution as in the case of a collection of spaced-apart narrow emission lines, or it may be a combination of narrow emission lines and a continuous broad band. Note that the phosphor light emitted by the different phosphor bodies need not be of the same type, and need not have the same spectral distribution, although in some cases it can be convenient for some or all of the phosphor bodies, or for an entire phosphor layer, to have the same composition and/or structure and to emit light of nominally the same spectral distribution, e.g. within manufacturing or design tolerances. Similarly, the various individual LEDs included in a given broadband light source (e.g., LEDs 121, 122) need not be of the same type and need not have the same spectral distribution, although in some cases it can be convenient for some or all of the individual LEDs to be of the same type and to emit light of nominally the same spectral distribution, e.g. within manufacturing or design tolerances. In some cases, some or all of the individual LEDs in a given broadband light source may have respective peak wavelengths that differ from each other by no more than 100, or 60, or 30, or 20, or 10 nm or so. A typical LED emission spectrum is depicted in FIG. 2a as curve 210. As shown there, for a given LED/phosphor pair, the phosphor light is generally distributed at longer wavelengths than the LED light.

The phosphor layer, whether uniform and continuous, or non-uniform and discontinuous, comprises one or more suitable phosphor materials. The phosphor materials preferably absorb light in a range that overlaps in wavelength with the emission spectrum of at least one of the LEDs, such that the LED can excite the phosphor and cause it to fluoresce or otherwise emit phosphor light. In many cases, a given phosphor material may absorb light in the ultraviolet, blue, and/or blue-green portion of the electromagnetic spectrum, and may emit light in the visible or near-visible region. The phosphor emission may have a spectral distribution that is a relatively smooth broad band, or a discontinuous set of narrow lines, as discussed above. Exemplary phosphor materials include known fluorescent dyes and phosphors. Cerium-doped yttrium aluminum garnet (Ce:YAG) is one example of a phosphor that may be used. Other rare-earth doped garnets or other rare-earth doped materials may also be suitable, e.g., europium- and/or strontium-doped silicates, nitrides, and aluminates, depending on design details and constraints of the light source.

Whether or not the dichroic reflector 116 transmits LED light emitted by the LEDs 121, 122, the LEDs are each responsible for a portion of the overall broadband light emitted by the source 110, which overall broadband light is preferably nominally white. Moreover, the portion of the broadband light that each LED is responsible for is also preferably broadband and nominally white.

For example, a first broadband light portion associated with LED 121 may be composed of some light from LED 121 that is transmitted by the dichroic reflector 116, and the portion of the phosphor light 129a-1 (which is excited by LED 121) that is transmitted by the dichroic reflector, which transmitted phosphor light portion makes up a part of the depicted phosphor light 139. If the LED 121 emits blue light, then the phosphor light 129a-1 may emit yellow phosphor light, so that the combination of the blue LED light and yellow phosphor light provides nominally white light. A second broadband light portion, associated with LED 122, may similarly be composed of some light from LED 122 that is transmitted by the dichroic reflector 116, and the portion of phosphor light 129b-1 (which is excited by LED 122) that is transmitted by the dichroic reflector (which makes up the remaining part of the depicted phosphor light 139). If the LED 122 emits blue light, then the phosphor light 129b-1 may emit yellow phosphor light, so that the combination of the blue LED light and yellow phosphor light again provides nominally white light. In alternative embodiments, the dichroic reflector 116 may be configured to transmit little or none of the LED light 131a, 132a, in which case the first and second broadband light portions may include little or no LED light, and may instead include only the respective portions of phosphor light 129a-1, 129b-1 that are transmitted by the dichroic reflector. The phosphor lights 129a-1 and 129b-1 may in such cases each be nominally white but still having somewhat different colors or shades.

The first broadband light portion associated with LED 121, and the second broadband light portion associated with LED 122, desirably have at least slightly different spectral distributions so that they are characterized by at least slightly different first and second colors, respectively. We contemplate several mechanisms by which the first and second broadband light portions can be made to have different colors. In a first mechanism, the placement of the different LEDs relative to the dichroic reflector, in combination with the spectral shift of the transmission and reflection properties of the dichroic reflector as a function of incidence angle, can be used to ensure that the spectral distribution of transmitted LED light is different for one LED relative to the other LED, and that the spectral distribution of the reflected LED light (which is used to excite the phosphor layer) is also different for one LED relative to the other LED, even if the two LEDs have identical spectral emission profiles. Thus, for example, identical blue light emitting LEDs disposed at different radial distances from an optical axis of the dichroic reflector may produce different amounts of blue light transmitted by the dichroic reflector as a result of more blue LED light being transmitted on average by the dichroic reflector as the angle of incidence increases. In a second mechanism, the phosphor layer (or portions thereof associated with the different LEDs, e.g., phosphor bodies 129a, 129b) may have different compositions or structures so that the phosphor light excited by one LED has a different spectral distribution or color than the phosphor light excited by another LED. In a third mechanism, the LEDs can be selected to have somewhat different emission spectra, e.g., they may have different peak wavelengths, and/or different emission bandwidths or different shapes of their spectral emission curves. With regard to this third mechanism, note that a difference in LED emission spectrum will also typically produce at least some difference in the spectrum of the phosphor light emitted by the phosphor layer, even if the effective reflection and transmission characteristics of the dichroic reflector are identical for the two LEDs, and even if the portions of the phosphor layer associated with the two LEDs have identical compositions and structures. All of the foregoing mechanisms can be used individually or in any combination to provide broadband light portions associated with the individual LEDs that have at least slightly different colors.

Figure 2B:
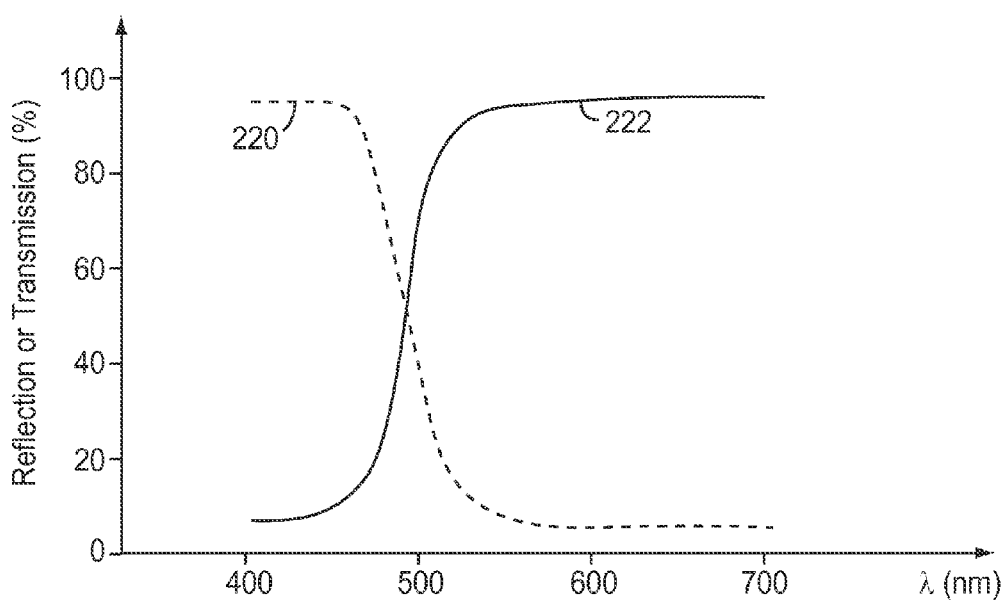
FIG. 2b is an idealized graph of the spectral reflectance and transmission of an exemplary dichroic reflector.

With regard to the first mechanism for providing different colors, the reader's attention is directed to FIGS. 2a and 2b in addition to FIG. 1. FIG. 2a is an idealized graph of the spectral intensity distributions of an exemplary blue LED, represented by curve 210, and an exemplary phosphor, represented by curve 212. These curves are meant to be representative of typical components, and are not necessarily intended to be limiting. FIG. 2b is an idealized graph of the spectral reflectance, shown by curve 220, and transmission, shown by curve 222, of an exemplary dichroic reflector. Again, these curves are meant to be representative and not necessarily limiting. By tailoring the dichroic reflector to have a relatively sharp band edge or transition from high reflection/low transmission to low reflection/high transmission, the dichroic reflector can more efficiently reflect LED light onto the phosphor, and transmit the phosphor light outwards. The curves 220, 222 are representative of reflection and transmission for light that impinges on the dichroic reflector at normal incidence, i.e., at an angle of incidence θ, measured relative to the surface normal, of zero degrees. As the angle of incidence θ increases from zero, the reflection and transmission properties of the dichroic reflector change. Details on how these properties change depend on the design of the dichroic reflector, e.g., the number of microlayers used, the thickness profile of the microlayers, and the refractive indices of the individual microlayers and surrounding media. At non-normal incidence, the reflection and transmission properties also in general become different for the different polarization components of the incident light, i.e., the p-polarization component (polarized in the plane of incidence) and the s-polarization component (polarized perpendicular to the plane of incidence). For purposes of describing the first mechanism for providing different colors, we ignore polarization effects (e.g., we may consider the average transmission and reflection spectra for the two polarization components) and we generalize the spectral dependence on angle of incidence θ by noting that the average transmission and reflection spectra of a given dichroic reflector typically shift to shorter wavelengths, indicated by the arrow in FIG. 2b, as the angle of incidence θ increases.

This angular shift associated with the dichroic reflector can be exploited for color purposes by tailoring the dichroic reflector and at least a first LED so that the band edge or transition region of the average transmission or reflection spectra of the dichroic reflector overlaps in wavelength to some extent with the spectral emission of the first LED, for at least some angles of incidence at which light from the first LED impinges on the dichroic reflector. The degree or extent of spectral overlap determines which portion of the light emitted by the first LED is transmitted, and which portion is reflected onto the phosphor layer. The second LED can then be positioned relative to the dichroic reflector so that light from the second LED impinges on the dichroic reflector at an angle or range of angles that differs from the corresponding angle or range of angles associated with the first LED. Depending on how the placement of the second LED differs from that of the first LED with respect to the dichroic reflector, the degree or extent of spectral overlap (if any) of the spectral emission of the second LED with the transition region of the average transmission or reflection spectra of the dichroic reflector can be made different from the corresponding spectral overlap associated with the first LED. For example, due to the different range of incidence angles associated with the second LED compared to the first LED, the spectral emission of the second LED may overlap with the transition region of the average transmission or reflection spectra of the dichroic reflector to a lesser degree than the overlap associated with the first LED, whereupon less (including little or no) LED light emitted by the second LED may be transmitted, and more such light may be reflected, relative to the first LED. Alternatively, the spectral emission of the second LED may overlap with the transition region of the average transmission or reflection spectra of the dichroic reflector to a greater degree than the overlap associated with the first LED, whereupon more LED light emitted by the second LED may be transmitted, and less such light may be reflected, relative to the first LED. In either case, the difference in spectral overlap results in more or less light of the second LED being present in the second broadband light portion, compared to the amount of light of the first LED present in the first broadband light portion. This difference in the relative amount of LED light, which may for example be or include blue visible light, that is present in the first and second broadband light portions, can give rise to a difference in color, color temperature, and/or correlated color temperature of the first and second broadband light portions.

Still in reference to the first mechanism for providing different colors, the reader will note in connection with FIG. 1 that, when considering the entire radiating surface of the LED 121 and the entire working surface area of the dichroic reflector 116, light from the LED 121 impinges on the dichroic reflector over a first range of incidence angles. Similarly, when considering the entire radiating surface of the LED 122 and the entire working surface area of the dichroic reflector 116, light from the LED 122 impinges on the dichroic reflector over a second range of incidence angles, which differs from the first range of incidence angles. For example, consider the limited portion of the dichroic reflector at or near an apex point 116a. At the point 116a, the dichroic reflector 116 has a surface normal coincident with a symmetry axis or optical axis 116b of the dichroic reflector (which optical axis may also coincide with an optical axis of the broadband source 110). Measured relative to this surface normal, LED light emitted by the various portions of the radiating surface of LED 121 strike the dichroic reflector at the point 116a over a first range of incidence angles, and LED light emitted by the various portions of the radiating surface of LED 122 strike the dichroic reflector at the point 116a over a second range of incidence angles, the second range of angles being greater than the first range of angles. In other words, LED light from the LED 122 strikes the dichroic reflector at the point 116a at incidence angles that are more oblique than LED light from the LED 121 that strikes the point 116a. This relationship is a consequence of the fact that the LEDs 121, 122 are disposed at different radial distances relative to the point 112a or relative to the optical axis 116b, and the relationship is also maintained at other portions of the dichroic reflector besides point 116a. That is, at points along the dichroic reflector 116 other than point 116a, LED light emitted by LED 122 similarly strikes the dichroic reflector at incidence angles that are more oblique than LED light emitted by LED 121. Thus, due to the fact that the LED 122 is disposed at a greater radial distance from the point 112a and/or from the optical axis 116b than LED 121, light emitted by the LED 122 strikes the dichroic reflector 116, on average when considering the entire radiating surface of the LED and the entire working surface of the dichroic reflector, at greater incidence angles than light emitted by the LED 121. The greater average incidence angle associated with LED 122 results in average reflection and transmission characteristics for the dichroic reflector 116 that are shifted to shorter wavelengths (see the arrow in FIG. 2b) relative to the average reflection and transmission characteristics of the dichroic reflector 116 associated with LED 121. This effective shift in wavelength of the characteristics of the dichroic reflector 116 can result in more LED light from LED 122 being transmitted (and less light from LED 122 being reflected) by the dichroic reflector than LED 121, which results in the second broadband light portion (associated with LED 122) having a different color than the first broadband light portion (associated with LED 121).

Note also that this same phenomenon of different average reflection and transmission characteristics for the dichroic reflector resulting from differences in radial distance to the point 112a and/or to the optical axis 116b may also have an effect on the amount of phosphor light that is transmitted by the dichroic reflector for phosphor body 129a, relative to phosphor body 129b. That is, phosphor body 129a is disposed at a smaller radial distance relative to point 112a and/or to optical axis 116b than phosphor body 129b. Consequently, the phosphor light emitted by the phosphor body 129a, which is included in the first broadband light portion, strikes the dichroic reflector 116 at an average incidence angle that is less than that of phosphor body 129b, and thus the reflection and transmission characteristics of the dichroic reflector for phosphor light from phosphor body 129b are shifted to shorter wavelengths relative to phosphor light from phosphor body 129a. In cases where the band edge or transition region of the dichroic reflector overlaps with the ((typically) shorter wavelength end of the) phosphor light spectral distribution, at least at some angles of incidence of the phosphor light, this can result in the dichroic reflector transmitting more phosphor light from the phosphor body 129b, compared to transmitted phosphor light from the phosphor body 129a. Stated differently, the dichroic reflector in such circumstances may transmit more phosphor light from a portion of a phosphor layer that is disposed at a greater distance from the symmetry axis or optical axis of the dichroic reflector, compared to a portion of the phosphor layer that is closer to the optical axis of the dichroic reflector. This difference in transmitted phosphor light, which is due to geometric factors, can also result in or contribute to a difference in color of the first and second broadband light portions.

With regard to the second mechanism for providing different colors for the first and second broadband light portions, this involves using different compositions or structures for the portions of the phosphor layer associated with the different LEDs. The phosphor body 129a, for example, is associated with LED 121 because light from LED 121 is reflected by the dichroic reflector 116 onto phosphor body 129a more than phosphor body 129b. Similarly, phosphor body 129b is associated with LED 122 because light from LED 122 is reflected by the dichroic reflector 116 onto phosphor body 129b more than phosphor body 129a. According to the second mechanism for providing different colors, the composition of the phosphor body 129b may be made different from that of body 129a. For example, a different phosphor material, or a different mix of phosphor materials, or different concentrations of a phosphor material or phosphor materials in a mix, can be used. These differences in phosphor composition can be tailored so that the phosphor light emitted by the different portions of the phosphor layer have different spectral distributions, i.e., different colors, color temperatures, and/or correlated color temperatures. Alternatively or in addition, the second mechanism may be accomplished by providing a different structure for the different portions of the phosphor layer. For example, the phosphor bodies 129a, 129b may be made to have different physical thicknesses, and/or the back surfaces of the phosphor bodies may be made to have different reflectivities, e.g., a highly reflective coating or surface may be provided at the back or rear surface of the body 129a, and a surface of lower reflectivity (or an absorptive coating or surface) may be provided at the back or rear surface of the body 129b. Such differences in structure for the various portions of the phosphor layer can also be used to ensure that phosphor light emitted by the different portions of the phosphor layer have different spectral distributions, i.e., different colors.

With regard to the third mechanism for providing different colors, the individual LEDs can be selected to have different emission spectra, e.g., they may have different peak wavelengths, and/or different emission bandwidths or different shapes of their spectral emission curves. Preferably, the LEDs emit wavelengths that are short enough to excite fluorescent radiation from the phosphor layer (although the broadband sources may also comprise one or more additional LEDs that may excite little or no fluorescence from the phosphor layer). In many cases, therefore, it is desirable for the LEDs to emit light in the ultraviolet, blue, and/or blue-green region of the electromagnetic spectrum. The various LEDs that are included in the broadband light source to excite fluorescent radiation may, for example, emit LED light in respective spectral distributions having respective peak wavelengths, the peak wavelengths ranging from about 430 to 530 nm, or from about 440 to 500 nm, or from about 445 to 480 nm. A first and second such LED may have respective first and second peak wavelengths that differ by no more than about 100, or 60, or 30, or 20, or 10 nm or less. Applicants note that even when a commercial order is submitted to an LED merchant for a quantity of LEDs of a single model or product code, the delivered LEDs may not have identical emission spectra, and may exhibit a non-negligible variability in peak emission wavelength due to variability in manufacture. Such LEDs may be sorted or binned according to peak wavelength or other spectral characteristic, and LEDs from the different bins, having different spectral content, can then be selected for incorporation into the disclosed broadband light sources as appropriate. The differences in the LED emission spectra are preferably sufficient to provide colors for the first and second broadband light portions that are measurably different.

As mentioned above, a difference in LED emission spectrum will also typically produce at least some difference in the spectrum of the phosphor light emitted by the phosphor layer, even if the effective reflection and transmission characteristics of the dichroic reflector are identical for the two LEDs, and even if the portions of the phosphor layer associated with the two LEDs have identical compositions and structures.

In reference again to FIG. 1, the bounded space 114 between the LEDs and the dichroic reflector may be composed of a gas or vacuum, in which case the dichroic reflector may be freestanding and self-supporting, or the dichroic reflector may be applied to an interior concave surface of a light-transmissive body located on an "outside" of the broadband light source 110. Alternatively, the bounded space 114 may be filled with a solid, liquid, or gelatinous light-transmissive material that encapsulates one, some, or all of the LEDs 121, 122 and phosphor bodies 129a, 129b. In exemplary embodiments the bounded space is filled with a clear encapsulant such as silicone polymer or gel, or other suitable materials. Such an encapsulant can provide the broadband light source 110 with physical integrity, and can be easily molded to have a suitably shaped concave outer surface to which the dichroic reflector can be readily applied.

The substrate 112 can be of any suitable design. The substrate may be flexible or rigid, as desired. The substrate may also include one or more conductive traces, and/or holes or "vias", by which electrical connection can be made to the LEDs or other electronic components of the broadband light source. Electrical connections can also be made by wire bonds or other suitable means, which are not depicted in the drawing.

A controller 140 may be provided to drive the drive the various LEDs included in the broadband source, e.g., to drive LED 121 via control line 141 and to drive LED 122 via control line 142. Note that the controller 140 also controls phosphor light emitted from the phosphor layer, since the phosphor body 129a is excited by LED light from LED 121, and the phosphor body 129b is excited by LED light from LED 122.

The controller may operate in an open-loop configuration or in a closed-loop configuration. In a closed-loop configuration, the controller is adapted to receive one or more detector signals from one or more detectors, and the controller drives or energizes the various LEDs in amounts or proportions that are a function of, or that are based on, the one or more detector signals. The one or more detector signals may thus be used as a feedback loop for the control of the LEDs. In a simple case, a single detector may be used, and the controller may drive the LEDs by different amounts or in different proportions depending upon the amplitude of the received detector signal. In other cases, multiple detectors can be used. The detector or detectors can be mounted on the substrate of the light source, or elsewhere as desired so as to intercept some of the LED and/or phosphor light emitted by the various components of the broadband light source. In some cases, one or more of the LEDs can be used as the detector(s), since light impinging on an LED can induce a current to flow across the diode. One or more LEDs, for example, may be used as dedicated detectors, whose detector output is fed to the controller. Alternatively or in addition, one or more LEDs can alternate in time or switch between an emitting state, in which the controller drives a current through the LED so that it emits light, and a sensing state, in which the controller connects the LED to a zero or low impedance load and monitors the current generated by the LED. In cases where multiple detectors are used, it can be advantageous for the detectors to have different spectral responses so that a comparison or other combination of the detector outputs can provide an indication of the color of the light falling on the detectors. The controller may calculate or otherwise provide a color parameter, e.g. by taking a ratio of two detector outputs for detectors of different spectral responses, and may adjust or otherwise control the drive signals for the different LEDs in a manner that causes the color parameter to remain within a specified boundary, such that the color of the overall output light of the broadband light source remains within a desired range.

Figure 3:
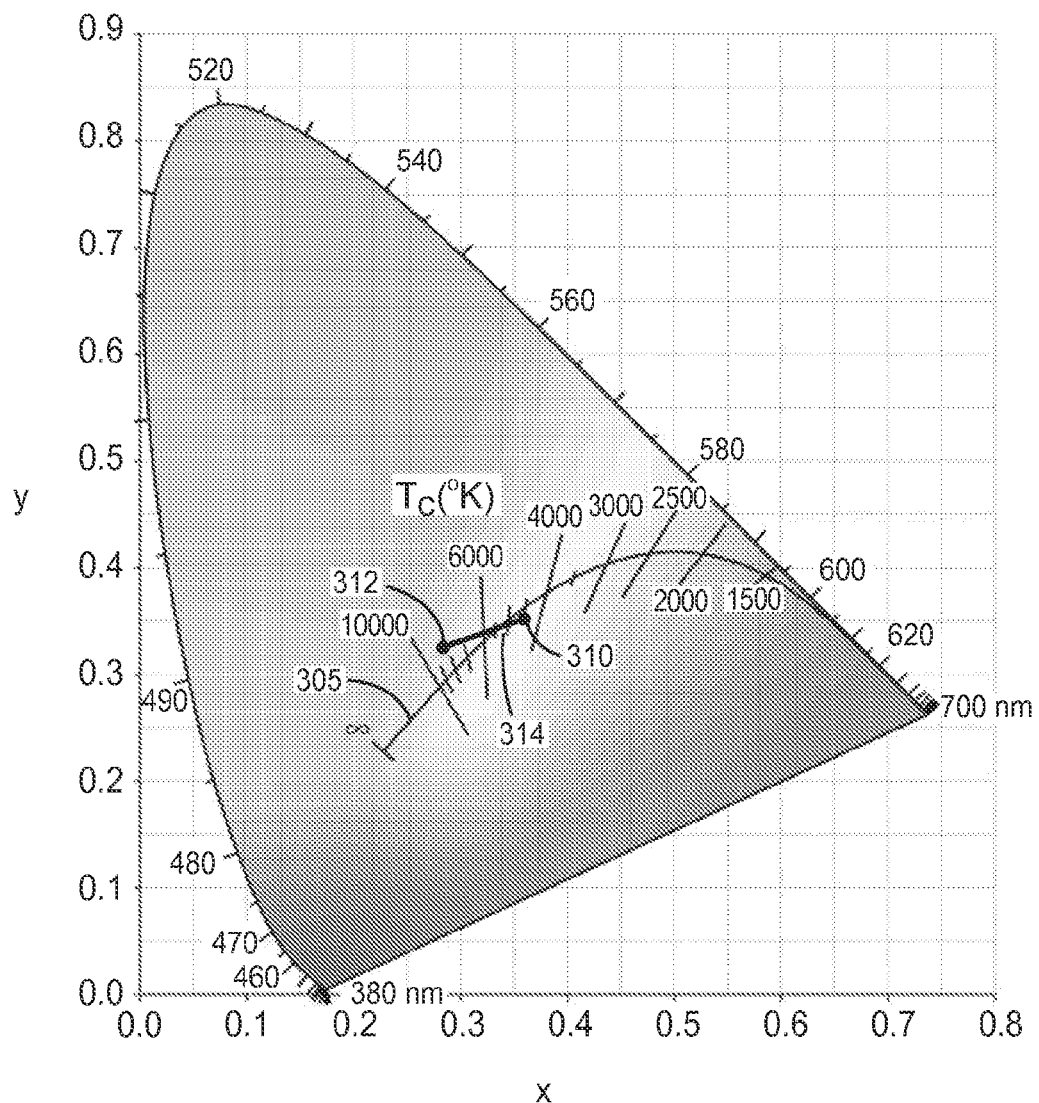
FIG. 3 is a graph of exemplary color points plotted in CIE color chromaticity coordinates.

Turning now to FIG. 3, we see there a graph of exemplary color points plotted on a CIE chromaticity diagram in CIE color chromaticity coordinates. These CIE chromaticity coordinates, sometimes referred to herein more simply as color coordinates, characterize a mathematically defined color space that was developed by the Commission international de l'eclairage ("CIE", or International Commission on Illumination) in 1931. The x and y chromaticity or color coordinates should not be confused with x and y coordinates associated with physical position or displacement, as shown with the x-y-z (physical) coordinate system of FIG. 1. Unlike the physical coordinates, the (x,y) chromaticity coordinates are unitless. Points associated with monochromatic light appear along the curved edge of the graph of FIG. 3, and these points are labeled with the wavelength of the monochromatic light, e.g., 380, 450, 460, . . . 780 nm. In the more central region of the graph, a curve 305 depicts the Planckian locus, i.e., the color coordinates of an ideal black body source as a function of the physical temperature $T_c$, of the black body, where $T_c$ is labeled in Kelvin. For any given color point located on the curve 305, the color temperature of that point is equal to the physical temperature of the black body for that point, expressed in Kelvin. For color points that are not located on the curve 305, the color can be expressed in terms of a "correlated color temperature". Correlated color temperature is known in the art of colorimetry to be the color temperature of an ideal black body whose perceived color most closely resembles that of the given color point, provided the given color point is sufficiently close to the Planckian locus.

Also in the central region of the graph of FIG. 3, where white and near-white colors can be found, two illustrative color points 310, 314 are shown, and a line segment 314 is shown connecting the points. The color point 310 represents the color of a first broadband light portion, e.g., light emanating from the source 110 composed of the portion of phosphor light 129a-1 that is transmitted by the dichroic reflector 116, and the portion (if any) of the corresponding LED light 131a that is transmitted by the dichroic reflector 116. The color point 312 represents the color of a second broadband light portion, e.g., light emanating from the source 110 composed of the portion of phosphor light 129b-1 that is transmitted by the dichroic reflector 116, and the portion (if any) of the corresponding LED light 132a that is transmitted by the dichroic reflector 116. The first and second broadband light portions are tailored to have different colors (as plotted on the CIE chromaticity diagram), and/or different color temperatures or correlated color temperatures, using one or more of the color tuning mechanisms described above. For example, the point 312 may have a higher proportion of short wavelength (blue) visible light as a result of the LED 122, which may emit visible blue light, being disposed at a greater radial distance from the optical axis 116b than the LED 121, which may also emit visible blue light, as explained above. If only the first LED (e.g. LED 121) is energized and the second LED (e.g. LED 122) is turned off, then the overall broadband emission from the light source 110 will include only the first broadband light portion, and the overall emission of the light source 110 will have a color represented by the point 310. On the other hand, if only the second LED (e.g. LED 122) is energized and the first LED (e.g. LED 121) is turned off, then the overall broadband emission from the light source 110 will include only the second broadband light portion, and the overall emission of the light source 110 will have a color represented by the point 312. Between these extremes, i.e., if both LEDs 121, 122 are energized, then the overall broadband emission from the light source 110 will include a mix of the first and second broadband light portions, and the color of the overall output will lie on the line segment 314—closer to point 310 if the first LED is driven more strongly than the second LED, and closer to point 312 if the second LED is driven more strongly. From this graph, it is apparent that the color of the overall output emission of the broadband light source can be set or adjusted by setting or adjusting the relative amounts by which the first and second LEDs are energized or driven, which controls the relative amounts by which the first and second broadband light portions are present in the overall output emission of the light source.

Figure 4:
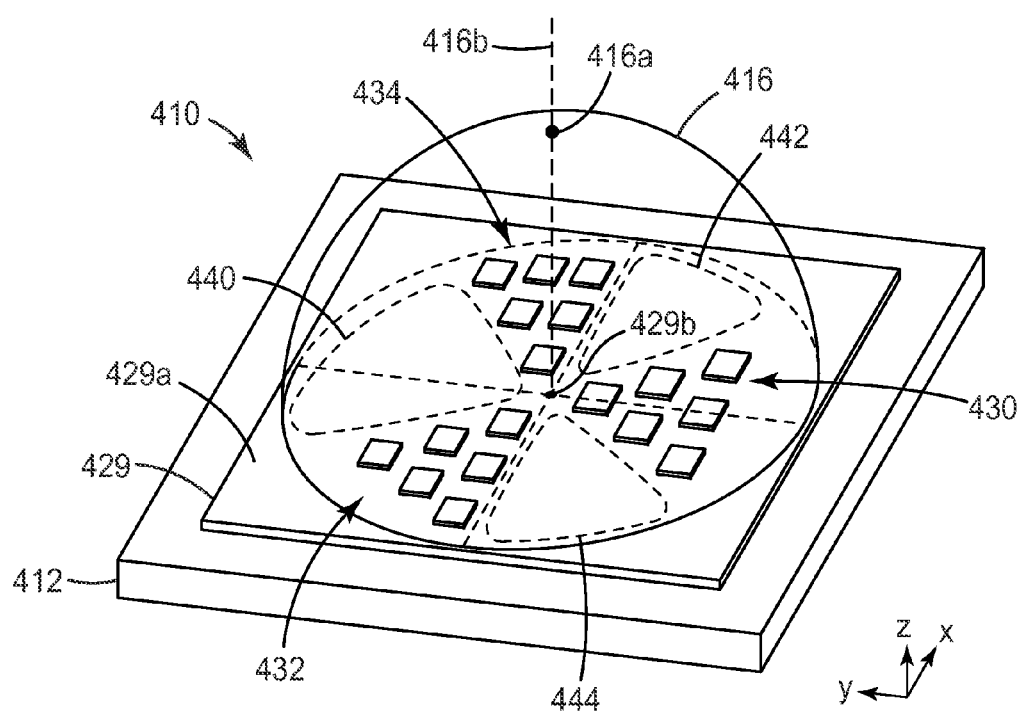
FIG. 4 is a schematic perspective view of an exemplary broadband light source.

Turning now to FIG. 4, we see there a schematic perspective view of an exemplary broadband light source 410, shown in the context of a Cartesian x-y-z coordinate system. The light source 410 includes a substrate 412, which may be the same as or similar to the other substrates described herein. The substrate 412 carries a phosphor layer 429 having an outer surface 429a and a reference point 429b. Eighteen LEDs are disposed atop or otherwise proximate the phosphor layer, the LEDs being arranged in three wedge-shaped groups 430, 432, 434 of six neighboring LEDs, each group of neighboring LEDs disposed in a wedge-shaped region of the substrate. The layout of the three wedge-shaped groups of LEDs, and the depicted number and orientation of LEDs in each group, is one of many possible arrangements, and should not be construed in a limiting way. For example, shapes other than wedge-like shapes are also contemplated. The LEDs are preferably encapsulated in a clear polymer or glass, or other suitable light-transmissive material, and an outer surface of the encapsulant may be concave and curved such that a dichroic reflector 416 can be applied and can shapingly conform to such surface. The dichroic reflector may be the same as or similar to the other dichroic reflectors described herein. The shape of the dichroic reflector 416 may define an apex 416a and a symmetry axis or optical axis 416b. The optical axis 416b may coincide with an optical axis of the source 410, and may pass through the reference point 429b and the apex 416a.

The groups of neighboring LEDs are separated from each other by unobstructed wedge-shaped portions 440, 442, 444 of the phosphor layer 429. "Unobstructed" in this regard refers to a portion of the phosphor layer 429 in which substantially no LEDs are present. Further, each group of neighboring LEDs resides in a wedge-shaped region of the substrate that is generally opposite one of the unobstructed wedge-shaped portions of the phosphor layer, from the perspective of the point 429b. Each pair of a wedge-shaped region of the substrate (e.g., the region in which wedge-shaped group 430 of LEDs resides) and its corresponding wedge-shaped portion of the phosphor layer (e.g., the portion 440) may also be generally symmetrical with respect to the point 429b. By configuring the dichroic reflector 416 such that the optical axis 416b passes through the point 429b, and by selecting a suitable radius of curvature of the dichroic reflector, the portion of LED light from each wedge-shaped group of neighboring LEDs that is reflected by the dichroic reflector can be imaged (at least approximately) onto its corresponding wedge-shaped portion of the phosphor layer.

The neighboring LEDs in each of the three LED groups are also shown to be arranged at different radial distances (measured parallel to the x-y plane) from the point 429b and/or from the optical axis 416b. In the depicted arrangement, for example, one LED in each group is disposed closest to the axis 416b, three LEDs in each group are disposed farthest from the axis 416b, and two LEDs in each group are disposed at an intermediate distance from the axis 416b.

In one embodiment of the light source 410, all eighteen LEDs may emit LED light according to a same LED emission spectrum, and the phosphor layer 429 may be of uniform composition and structure such that the composition and structure of the phosphor layer is the same throughout and amongst the wedge-shaped portions 440, 442, 444; yet the properties of the dichroic reflector can be tailored to provide different broadband light portions (associated with different LEDs) that have different colors. In particular, a color of a first broadband light portion associated with the subgroup of the one "near" LED (in each group of neighboring LEDs), can differ from a color of a second broadband light portion associated with the subgroup of the two "intermediate" LEDs (in each group of neighboring LEDs), which in turn may differ from a color of a third broadband light portion associated with the subgroup of the three "far" LEDs (in each group of neighboring LEDs). This may be accomplished by ensuring that the spectral band edge or transition region of the average transmission or reflection spectra of the dichroic reflector overlaps with the spectral emission of at least the subgroup of two "intermediate" LEDs and the subgroup of three "far" LEDs, at least at some incidence angles, such that the dichroic reflector transmits a greater fraction of LED light from the subgroup of two intermediate LEDs compared to the subgroup of one near LED, the dichroic reflector also transmitting a greater fraction of LED light from the subgroup of three far LEDs compared to the subgroup of two intermediate LEDs. The relative increase in transmitted short wavelength LED light with increasing radial distance from the optical axis 416b can provide the different colors of the different broadband light portions. And the color of the overall broadband light emission from the source 410 may be controlled or adjusted by controlling the relative degree to which the subgroup of one near LED, the subgroup of two intermediate LEDs, and the subgroup of three far LEDs are energized.

In another embodiment of the light source 410, different colors can be achieved for different broadband light portions by using different compositions and/or structures for portions of the phosphor layer associated with different LEDs. For example, the wedge-shaped portion 440 of the phosphor layer 429, which is excited by the six LEDs of LED group 430, may have a different composition and/or structure than that of portions 442 and/or 444. The color of the overall broadband light emission from the source may then be controlled or adjusted by controlling or adjusting the relative degree to which one group of neighboring LEDs (e.g. LED group 430) is energized compared to the other groups of neighboring LEDs (e.g. LED groups 432, 434). Additionally or in the alternative, one, some, or all of the wedge-shaped portions 440, 442, 444, may have a composition and/or structure that is different at different radial distances from the optical axis 416b or reference point 429b. Because of the imaging properties of the curved dichroic reflector 416, the subgroup of one near LED in each group of neighboring LEDs tends to preferentially excite the portion of the wedge-shaped phosphor portion nearest the reference point 429b, and the subgroup of two intermediate LEDs in each group of neighboring LEDs tends to preferentially excite a middle portion of the wedge-shaped phosphor portion, and the subgroup of three far LEDs in each group of neighboring LEDs tends to preferentially excite the portion of the wedge-shaped phosphor portion farthest the reference point 429b. A radially-varying phosphor layer can therefore be used to control or adjust the color of the overall broadband light emission from the source 410 by adjusting or controlling the relative degree to which the subgroup of one near LED, the subgroup of two intermediate LEDs, and the subgroup of three far LEDs are energized.

In another embodiment of the light source 410, different colors can be achieved for different broadband light portions by selecting individual LEDs that have different emission spectra, and then controlling or adjusting the relative degree to which LEDs of different emission properties are energized.

Figure 5:
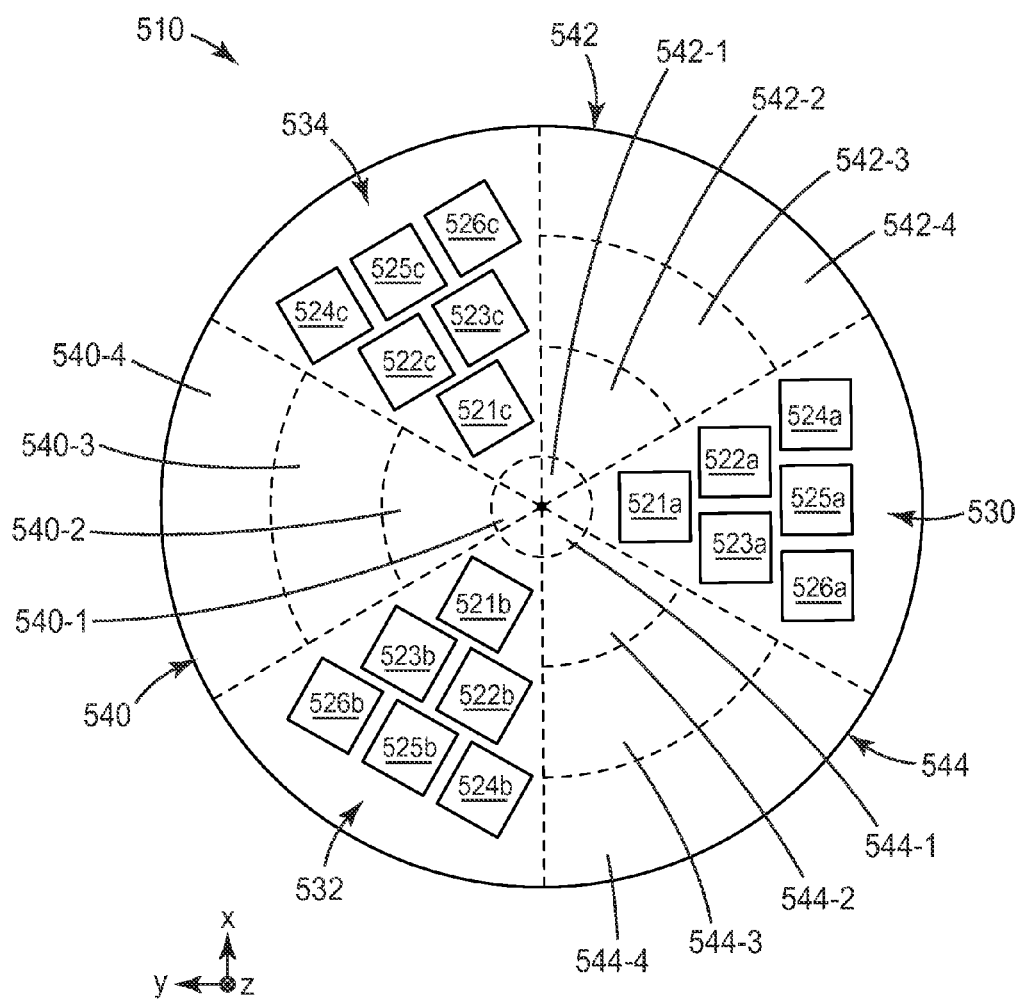
FIG. 5 is a schematic top or plan view of a portion of a broadband light source.

FIG. 5 shows a schematic top or plan view of a portion of a broadband light source 510, which may be the same as or similar to light source 410. In the source 510, which is drawn relative to a Cartesian x-y-z coordinate system, a phosphor layer and/or substrate is partitioned into six wedge-shaped regions or portions, opposed pairs of which may be substantially congruent to each other. Eighteen LEDs are arranged on the substrate or phosphor layer in a manner similar to that shown in FIG. 4, i.e., in three wedge-shaped groups 530, 532, 534 of six neighboring LEDs, each group of neighboring LEDs disposed in one of the wedge-shaped regions of the substrate. Each of these groups of LEDs is arranged opposite an unobstructed wedge-shaped portion of the phosphor layer, from the perspective of the central point (not labeled) shown in the center of the device. Thus, LED group 530 is arranged opposite wedge-shaped phosphor portion 540, LED group 532 is arranged opposite wedge-shaped phosphor portion 542, and LED group 534 is arranged opposite wedge-shaped phosphor portion 544. In exemplary embodiments, a concave dichroic reflector is provided to partially or completely cover the portion of the light source depicted in FIG. 5. The dichroic reflector, which may be the same as or similar to dichroic reflectors discussed elsewhere herein, may be disposed on a surface of a light-transmissive encapsulant, and may have a symmetry axis or optical axis parallel to the z-axis and passing through the central point (not labeled). Such a reflector can reflect at least some light from the various LEDs onto selected portions of the phosphor layer so that the different LEDs primarily excite different portions of the phosphor layer. If we consider the phosphor portions 540, 542, 544 as comprising subportions at different radial distances from the central point, i.e. portion 540 comprising subportions 540-1, 540-2, 540-3, 540-4, portion 542 comprising subportions 542-1, 542-2, 542-3, 542-4, and portion 544 comprising subportions 544-1, 544-2, 544-3, 544-4, the dichroic reflector may reflect LED light from the various LEDs preferentially onto the various phosphor layer subportions as follows:

light from LED 521a onto phosphor subportion 540-2;
light from LEDs 522a, 523a onto phosphor subportion 540-3;
light from LEDs 524a, 525a, 526a onto phosphor subportion 540-4;
light from LED 521b onto phosphor subportion 542-2;
light from LEDs 522b, 523b onto phosphor subportion 542-3;
light from LEDs 524b, 525b, 526b onto phosphor subportion 542-4;
light from LED 521c onto phosphor subportion 544-2;
light from LEDs 522c, 523c onto phosphor subportion 544-3; and
light from LEDs 524c, 525c, 526c onto phosphor subportion 544-4.

The reader will keep in mind that the preferential reflection of LED light should not be so narrowly construed as to require all of the reflected LED light from a given LED to impinge on the specified phosphor subportion, and that some reflected LED light from such LED may also impinge on other phosphor subportions and/or on other LEDs or other elements of the source.

In one embodiment of the light source 510, all eighteen LEDs may emit LED light according to a same LED emission spectrum, and the phosphor layer may be of uniform composition and structure such that the composition and structure of the phosphor layer is the same throughout and amongst the wedge-shaped portions 540, 542, 544; yet the properties of the dichroic reflector can be tailored to provide different broadband light portions (associated with different LEDs) that have different colors. In particular, a color of a first broadband light portion associated with the subgroup of "near" LEDs 521a, 521b, 521c, can differ from a color of a second broadband light portion associated with the subgroup of "intermediate" LEDs 522a, 523a, 522b, 523b, 522c, 523c, which in turn may differ from a color of a third broadband light portion associated with the subgroup of "far" LEDs 524a, 525a, 526a, 524b, 525b, 526b, 524c, 525c, 526c. This may be accomplished by ensuring that the spectral band edge or transition region of the average transmission or reflection spectra of the dichroic reflector overlaps with the spectral emission of at least the subgroup of "intermediate" LEDs 522a, 523a, 522b, 523b, 522c, 523c, and the subgroup of "far" LEDs 524a, 525a, 526a, 524b, 525b, 526b, 524c, 525c, 526c, at least at some incidence angles, such that the dichroic reflector transmits a greater fraction of LED light from the subgroup of intermediate LEDs compared to the subgroup of near LEDs 521a, 521b, 521c, the dichroic reflector also transmitting a greater fraction of LED light from the subgroup of far LEDs compared to the subgroup of intermediate LEDs. The relative increase in transmitted short wavelength LED light with increasing radial distance from the optical axis of the dichroic reflector can provide the different colors of the different broadband light portions. And the color of the overall broadband light emission from the source 510 may be controlled or adjusted by controlling the relative degree to which the subgroups of near, intermediate, and far LEDs are energized.

In another embodiment of the light source 510, different colors can be achieved for different broadband light portions by using different compositions and/or structures for portions of the phosphor layer associated with different LEDs. For example, the wedge-shaped portion 540, which is excited by the six LEDs of LED group 530, may have a different composition and/or structure than that of portions 542 and/or 544. The color of the overall broadband light emission from the source may then be controlled or adjusted by controlling or adjusting the relative degree to which one group of neighboring LEDs (e.g. LED group 530) is energized compared to the other groups of neighboring LEDs (e.g. LED groups 532, 534). Additionally or in the alternative, one, some, or all of the wedge-shaped portions 540, 542, 544, may have a composition and/or structure that is different at different radial distances from the optical axis of the dichroic reflector or the central point (not labeled). Because of the imaging properties of the concave dichroic reflector, the subgroup of one near LED in each group of neighboring LEDs tends to preferentially excite the portion of the wedge-shaped phosphor portion nearest the central point, and the subgroup of two intermediate LEDs in each group of neighboring LEDs tends to preferentially excite a middle portion of the wedge-shaped phosphor portion, and the subgroup of three far LEDs in each group of neighboring LEDs tends to preferentially excite the portion of the wedge-shaped phosphor portion farthest the central point. A radially-varying phosphor layer can therefore be used to control or adjust the color temperature of the overall broadband light emission from the source 510 by adjusting or controlling the relative degree to which the subgroups of near LEDs, intermediate LEDs, and far LEDs are energized.

In another embodiment of the light source 510, different colors can be achieved for different broadband light portions by selecting individual LEDs that have different emission spectra, and then controlling or adjusting the relative degree to which LEDs of different emission properties are energized.

Figure 6:
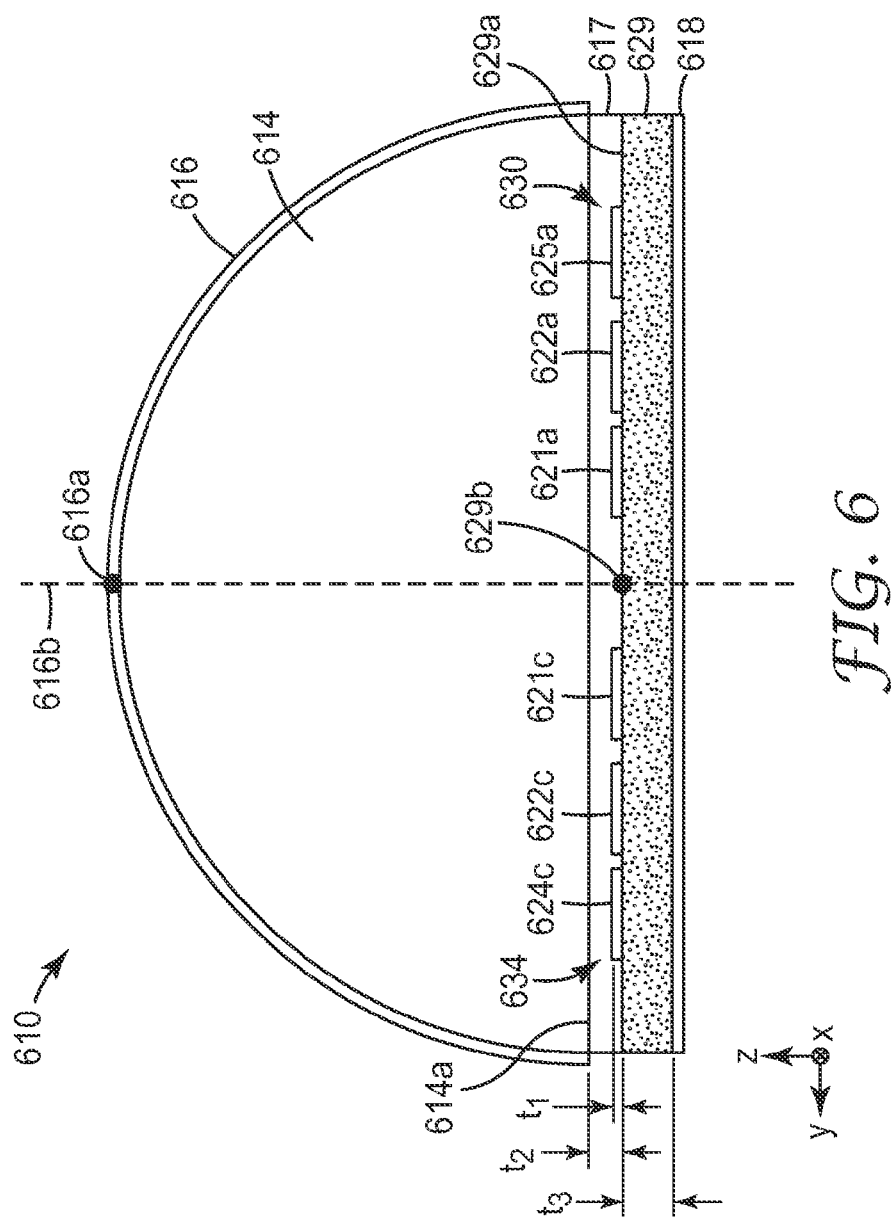
FIG. 6 is a schematic side or sectional view of another exemplary broadband light source.

FIG. 6 is a schematic side or sectional view of another exemplary broadband light source 610, which may be the same as or similar to the light sources 410 and 510. In the source 610, which is drawn relative to a Cartesian x-y-z coordinate system, LEDs 621a, 622a, 625a, 621c, 622c, 624c are disposed on a major surface 629a of a phosphor layer 629, which in turn is disposed on a reflective substrate 618. The LEDs are encapsulated in a first encapsulating member 617, atop which is formed a second encapsulating member 614. The first and second encapsulating members may be composed of different light-transmissive materials, e.g., different transparent polymer materials, but in other embodiments the first and second encapsulating members may be made of the same material such that the members form a unitary component. The second member 614 is shown to have a flat surface 614a in contact with the first member 617. The second member also has a curved outer surface on which is formed a dichroic reflector 616. The concave shape of the curved outer surface, and of the dichroic reflector 616, define a symmetry axis or optical axis 616b, which passes through an apex 616a of the dichroic reflector and through a central point 629b on the surface 629a of the phosphor layer 629.

The view of FIG. 6 does not provide complete information regarding the arrangement or layout of the LEDs on the surface 629a. In one embodiment, the LEDs can be grouped together in wedge-shaped regions similar to those shown in FIGS. 4 and 5. For example, LEDs 621a, 622a, 625a may be three LEDs in a group of six neighboring LEDs similar to LEDs 521a, 522a, 523a, 524a, 525a, 526a in FIG. 5, and LEDs 621c, 622c, 624c may be three LEDs out of a group of six neighboring LEDs similar to LEDs 521c, 522c, 523c, 524c, 525c, 526c in FIG. 5. Alternatively, the LEDs may be positioned on the surface 629a in any other arrangement, either in groups of neighboring LEDs, or in a dispersed or spaced-apart arrangement, or in a combination of neighboring and dispersed LEDs, such that light from a given LED is reflected by the dichroic reflector 616 onto a portion of the phosphor surface 629a that is not substantially occluded by other LEDs. In any case, as light propagates from one, some, or all of the LEDs to the dichroic reflector, it does not pass through the phosphor layer. The LEDs may be connected to a controller by lead lines, wire bonds, or other conductive elements that are not shown for simplicity.

The phosphor layer may be the same as or similar to phosphor layers described elsewhere herein, and it may comprise one or more phosphor materials described elsewhere herein. In one embodiment, the phosphor layer may be or comprise a layer of transparent polymer in which a multitude of phosphor particles are dispersed. The phosphor layer 629 is assumed to have a thickness t3 that is small enough so that the layer 629 is partially light-transmissive, such that at least some reflected LED light propagates completely through the layer 629 and strikes the reflective substrate 618. The LED light reflected by the reflective substrate may then propagate back through the phosphor layer 629, for another opportunity to be absorbed by a phosphor material.

The source 610 may be configured to provide an overall broadband light emission that is made up of a plurality of broadband light portions having different colors, using any of the techniques discussed above.

For example, the dichroic reflector 616 may have a spectral band edge or transition region of the average transmission or reflection spectra that overlaps with the spectral emission of one, some, or all of the LEDs at least at some incidence angles, such that the dichroic reflector transmits a greater fraction of LED light from some LEDs (e.g., LEDs that are disposed at greater radial distances to the optical axis 616b, such as LEDs 625a and 624c) compared to other LEDs (e.g., LEDs that are disposed at smaller radial distances to the optical axis 616b, such as LEDs 621a and 621c). The relative increase in transmitted short wavelength LED light with increasing radial distance from the optical axis 616b can provide the different colors of the different broadband light portions. The color of the overall broadband light emission from the source 610 may then be controlled or adjusted by controlling the relative degree to which the different LEDs are energized, e.g. by controlling the respective electrical drive currents used to energize the LEDs.

Alternatively, different colors can be achieved for different broadband light portions by using different compositions and/or structures for portions of the phosphor layer 629 associated with different LEDs, as described above. Furthermore, different colors can be achieved for different broadband light portions by selecting individual LEDs that have different emission spectra, and then controlling or adjusting the relative degree to which LEDs of different emission properties are energized.

MODELED EXAMPLES

A broadband light source similar to that shown in FIG. 6 was modeled with optical design software. The modeled design assumed the source utilized eighteen LEDs arranged into three groups of six neighboring LEDs, substantially as shown in the plan view of FIG. 5. All eighteen LEDs were assumed to have identical physical and optical properties. Each LED was assumed to be a gallium nitride-on-sapphire (GaN/sapphire) LED die having a square shape in plan view, of dimension 1 mm by 1 mm, and a thickness (see dimension t1 in FIG. 6) of 10 microns. The back or rear square surface of each LED was assumed to have a 50% reflectivity at all wavelengths. Each LED die was assumed to emit blue light in an emission band having a peak wavelength of 455 nm and a spectral width, measured as the full-width-at-half-maximum (FWHM), of 15 nm. This blue LED light is plotted on a normalized power scale in FIG. 7 as curve 716. The graph of FIG. 7 also shows the spectral reflectivity of the modeled dichroic reflector for different angles of incidence, discussed further below.

The LEDs were assumed to be immersed in a silicone matrix having a refractive index of 1.41 and a physical thickness (see dimension t2 in FIG. 6) of 49 microns. Atop the layer of silicone was a hemispherical lens of refractive index 1.5, corresponding to element 614 in FIG. 6, which was simulated as Schott™ BK7 glass. The hemispherical lens was assumed to have a radius of curvature of 7.5 mm, and an apex and axis of symmetry as shown in FIG. 6.

Covering the entire curved outer surface of the hemispherical lens was a dichroic reflector. The reflector was assumed to have six microlayers of silicon dioxide ($SiO_2$) interleaved with six microlayers of titanium dioxide ($TiO_2$) so as to form six layer pairs or "optical repeat units". The thickness profile of the layer pairs was tailored to provide the spectral reflectivity shown in FIG. 7. Curve 710 is the reflectivity of the dichroic reflector at an incidence angle of 0 degrees (i.e., normal incidence). Curve 712 is the average reflectivity at an incidence angle of 20 degrees, where "average" here refers to an average of s-polarized light and p-polarized light. Curve 714 is likewise the average reflectivity of the dichroic reflector at an incidence angle of 40 degrees. The incidence angles referred to in this paragraph are incidence angles as measured in the medium of the hemispherical lens, i.e., in a medium of refractive index 1.5. The dichroic reflector was assumed to have no absorption, hence, the percent transmission (or percent average transmission) of the dichroic reflector can be readily calculated as 100% minus the percent reflection (or percent average reflection) for any given incidence angle and wavelength.

Figure 7:
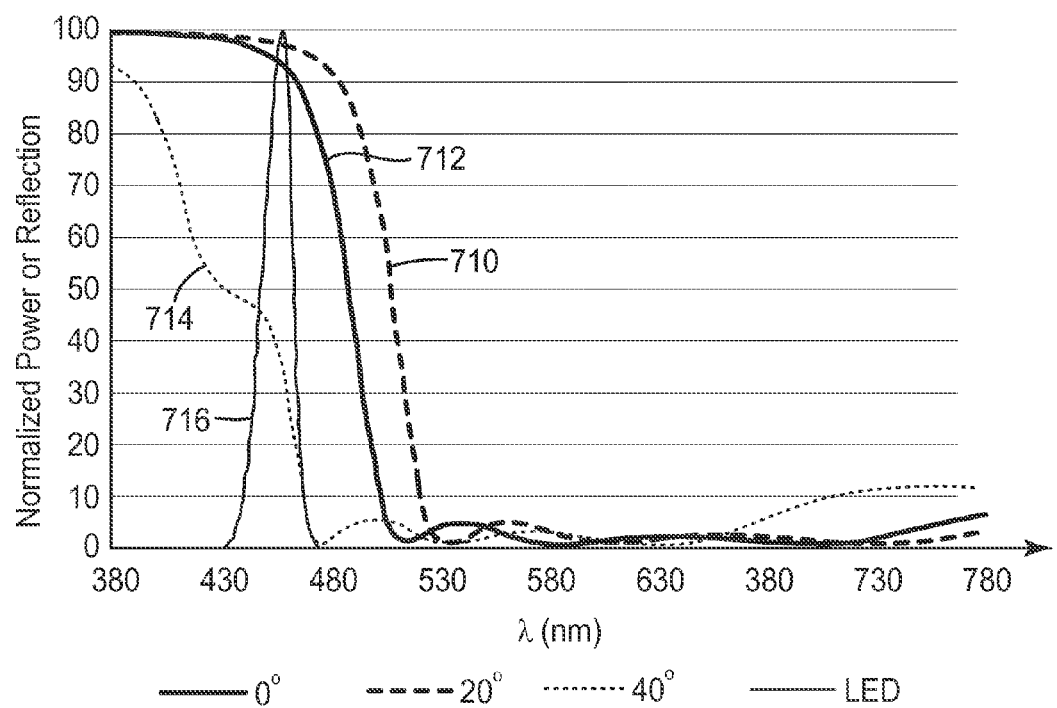
FIG. 7 is a graph of the spectral reflectivity of a modeled dichroic reflector for different angles of incidence, and superimposed thereon a graph of the normalized power spectrum of an exemplary blue LED.

From the graph of FIG. 7, one can see that the dichroic reflector has a band edge or spectral transition region that overlaps in wavelength to some extent with the spectral emission of the LEDs, at least for some angles of incidence at which light from the various LEDs impinge on the dichroic reflector. In this regard, the various LEDs emit light that impinges on the dichroic reflector at different incidence angles, as a result of the arrangement of the LEDs on the surface of the phosphor layer, particularly because of the fact that some LEDs (see e.g. LEDs 521a, 521b, and 521c in FIG. 5) are disposed at relatively small radial distances to the optical axis of the dichroic reflector, and other LEDs (see e.g. LEDs 524a, 525a, 526a, 524b, 525b, 526b, 524c, 525c, and 526c in FIG. 5) are disposed at relatively large radial distances to the optical axis. The modeled LEDs corresponding to LEDs 521a, 521b, 521c in FIG. 5, for example, emit light that impinges on the modeled dichroic reflector at incidence angles that range from about 0 to 12 degrees. The modeled LEDs corresponding to LEDs 524a, 526a, 524b, 526b, 524c, and 526c in FIG. 5, on the other hand, emit light that impinges on the modeled dichroic reflector at incidence angles that range from about 0 to 31 degrees. The incidence angles mentioned in this paragraph are incidence angles as measured in the medium of the hemispherical lens, i.e., in a medium of refractive index 1.5.

The modeled phosphor layer, which was uniform in composition and structure over its entire area, assumed 15 micron diameter spherical particles of Ce:YAG phosphor were uniformly distributed in a transparent material of refractive index 1.8. The concentration of the particles in the layer was 15,000 particles per cubic millimeter. The physical thickness of the phosphor layer was assumed to be 100 microns. Ce:YAG absorbs blue and ultraviolet light, and emits light in a relatively smooth emission band that is broadband has a yellow appearance. The yellow phosphor light, when combined with an appropriate amount of blue LED light, produces nominally white light.

The modeled reflective substrate (see element 618 in FIG. 6) was assumed to have a 94% reflectivity for all visible wavelengths, which is similar to the reflectivity of silver.

With this modeled broadband light source, we were able to selectively energize selected ones of the eighteen LEDs, and we observed (computed) characteristics of the resulting broadband light that was generated. In particular, we calculated characteristics of the resulting light in two observation planes: a lower observation plane that coincided with the planar surface (see surface 614a in FIG. 6) of the hemispherical lens, and an upper observation plane that was parallel to the lower plane but disposed above the curved surface of the hemispherical lens, the upper plane being spaced apart from the apex of the lens (see point 616a in FIG. 6) by a distance of 2.35 mm. Modeled light rays passing through these observation planes were tabulated and the information was converted into spatial intensity plots, which are shown in FIGS. 8 through 14. Color coordinates and correlated color temperature for the light in the upper observation plane were also calculated. Note that the terms "lower" and "upper" are used only for convenience in description, and should not be construed in a limiting way.

Figure 8A:
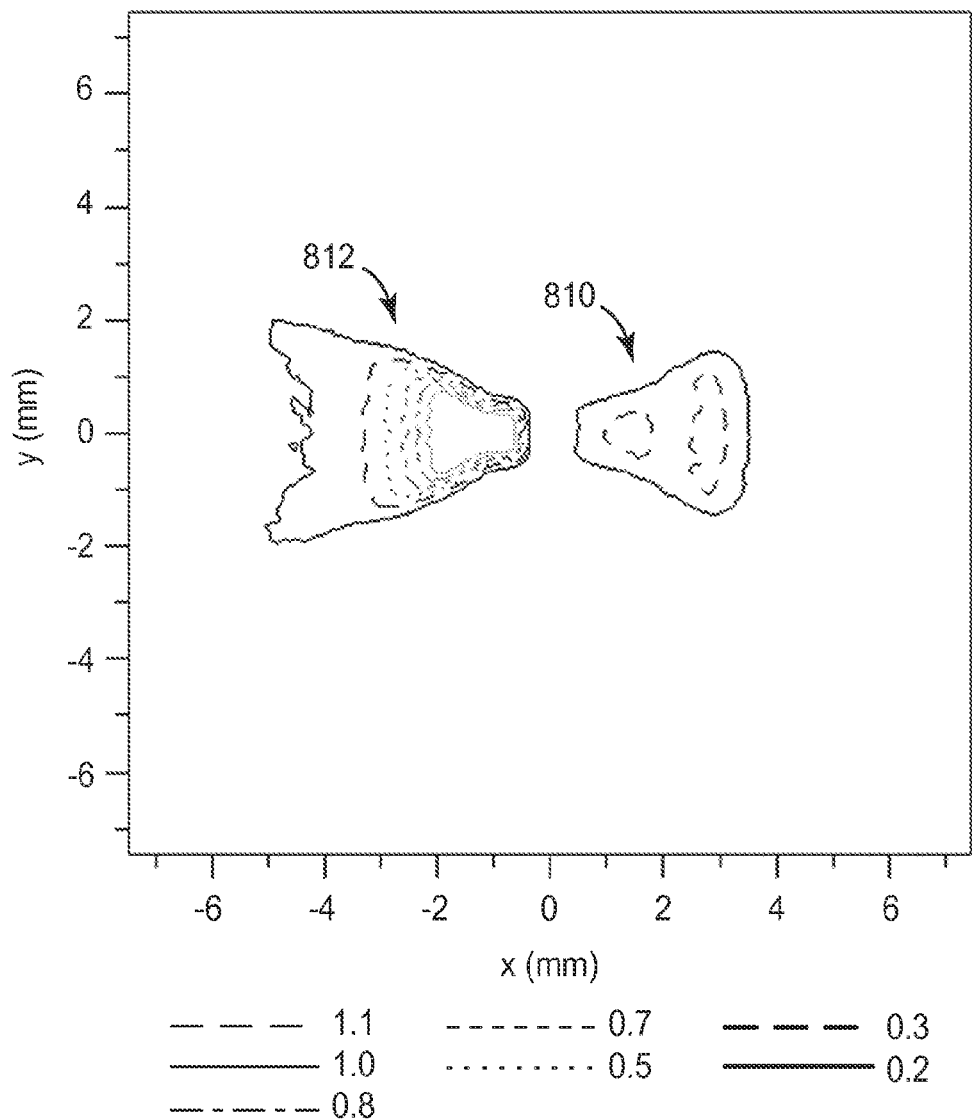
FIGS. 8a, 9a, 10a, 11a, 12a, 13a, and 14a are spatial intensity plots of modeled intensity as a function of position in a lower detection plane for a modeled broadband light source, the figures differing by which individual LEDs were selected to be energized.
Figure 8B:
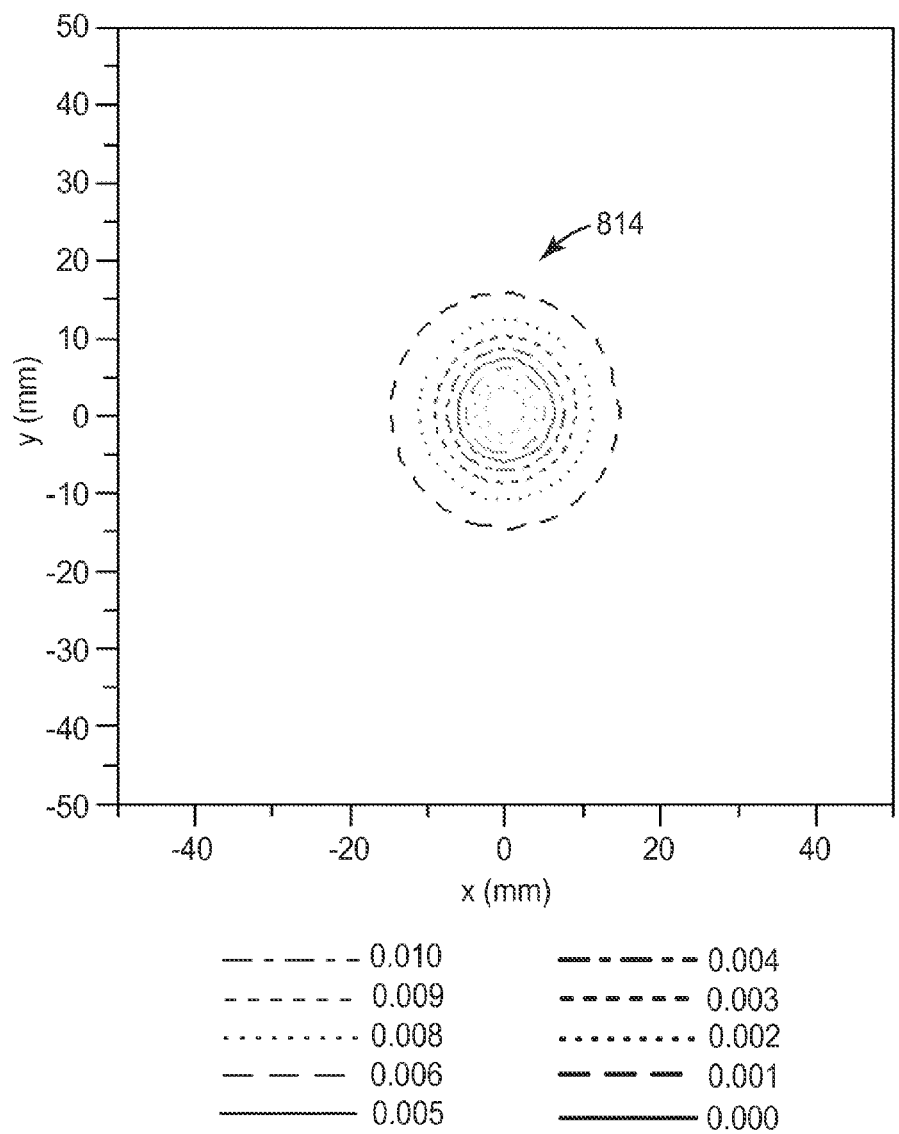
FIGS. 8b, 9b, 10b, 11b, 12b, 13b, and 14b are spatial intensity plots corresponding to those of FIGS. 8a, 9a, 10a, 11a, 12a, 13a, and 14a, respectively, except that the modeled intensity in an upper detection plane is shown in the former figures.

In a first energizing scheme, all LEDs in one group of six neighboring LEDs were energized by equal amounts, and the remaining twelve LEDs were not energized and remained "off". Thus, in reference to the LED arrangement of FIG. 5, the six LEDs in wedge-shaped LED group 530 were energized by equal amounts, and the other LEDs were not energized. FIG. 8a shows the modeled spatial intensity of light observed at the lower observation plane. FIG. 8b shows the modeled spatial intensity of light observed at the upper observation plane. In each figure, the contour curves represent curves of equal intensity, and the line types are labeled at the bottom of the graph with the calculated intensity value. The x- and y-axes for each figure represent the position coordinates for the observation plane, where the point (0,0) corresponds to the center of the light source (see the unlabeled central point in FIG. 5, and central point 629b in FIG. 6). Note that the x- and y-axes for the intensity graphs differ from those of FIG. 5: the x-axis in the intensity graphs is parallel to the y-axis in FIG. 5, and the y-axis in the intensity graphs is parallel to the x-axis in FIG. 5.

In the lower observation plane (FIG. 8a), we see an illumination area 810 corresponding to the wedge-shaped group of neighboring (energized) LEDs, and we see another illumination area 812 corresponding to phosphor light emitted as a result of the phosphor layer being excited by LED light that was reflected by the dichroic reflector. In the upper observation plane (FIG. 8b), we see a rotationally symmetric light spot 814 emitted by the light source. The emitted light was broadband and nominally white, and its color was calculated to have a CIE x value of 0.341, and a CIE y value of 0.354. The correlated color temperature of this light was about 5292 K.

Figure 9A:
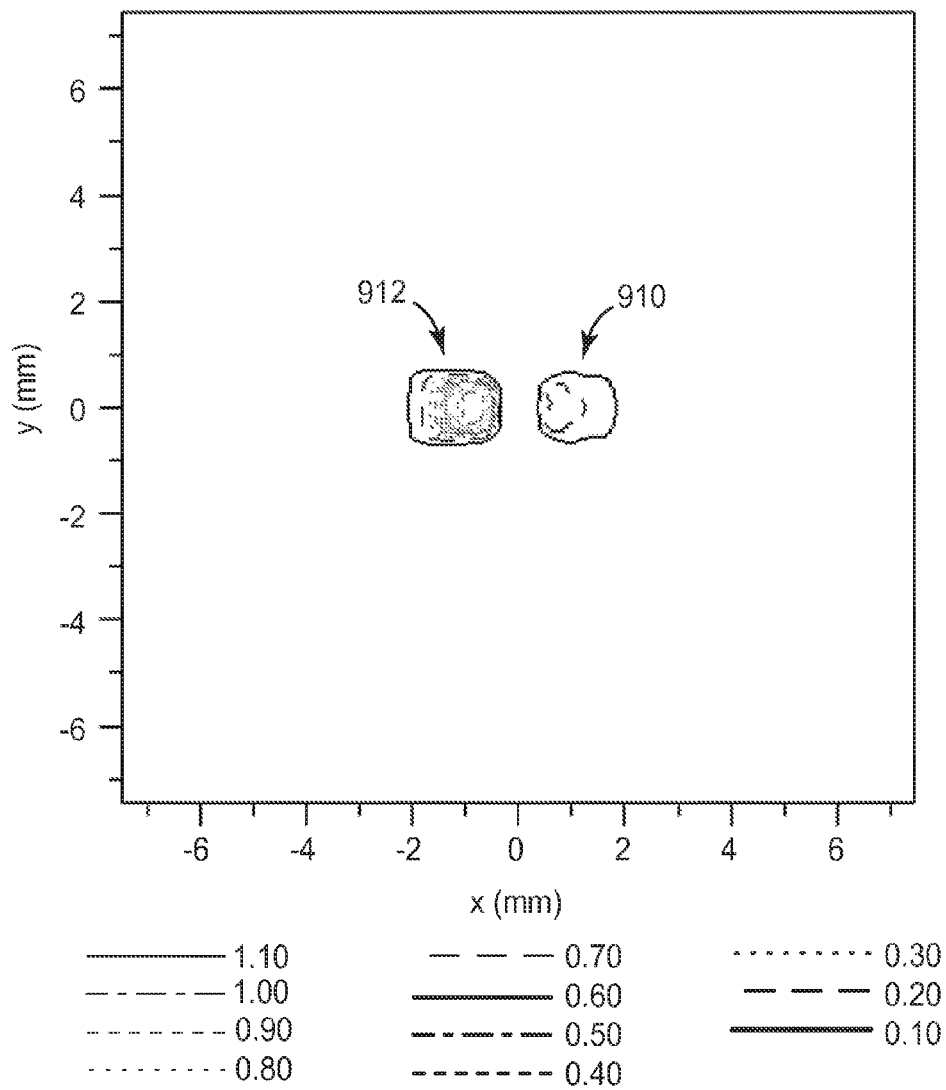
Figure 9B:
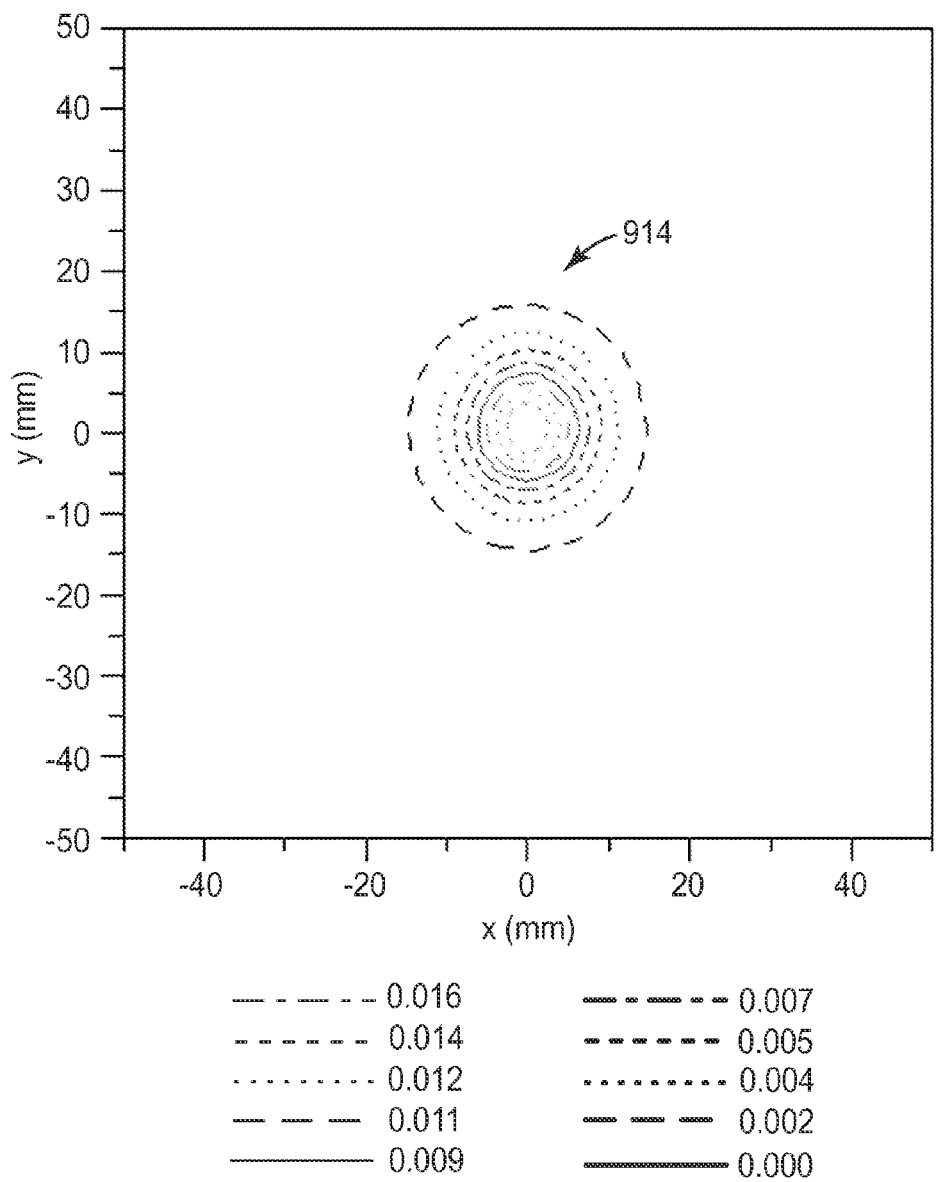

In a second energizing scheme, only one LED was energized, and the remaining LEDs remained "off". The energized LED was one of those nearest the optical axis, see e.g. LED 521a in FIG. 5. FIG. 9a shows the modeled spatial intensity of light observed at the lower observation plane, and FIG. 9b shows the modeled spatial intensity of light observed at the upper observation plane, just as in FIGS. 8a and 8b respectively. In the lower observation plane (FIG. 9a), we see an illumination area 910 corresponding to the single energized LED, and we see another illumination area 912 corresponding to phosphor light emitted as a result of the phosphor layer being excited by LED light reflected by the dichroic reflector. In the upper observation plane (FIG. 9b), we see a rotationally symmetric light spot 914 emitted by the light source. The emitted light was broadband and nominally white, and its color was calculated to have a CIE x value of 0.408, and a CIE y value of 0.468. The correlated color temperature of this light was calculated to be 3976 K.

Figure 10A:
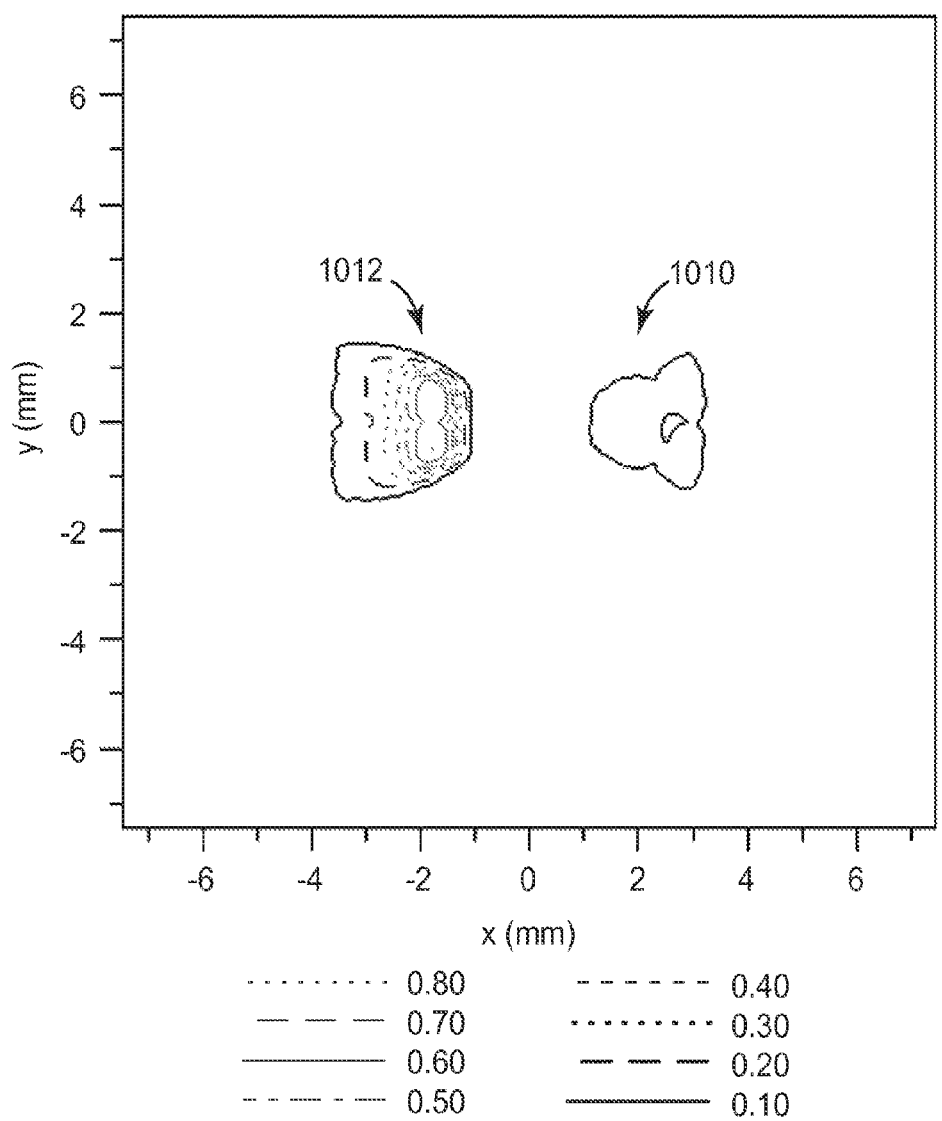
Figure 10B:
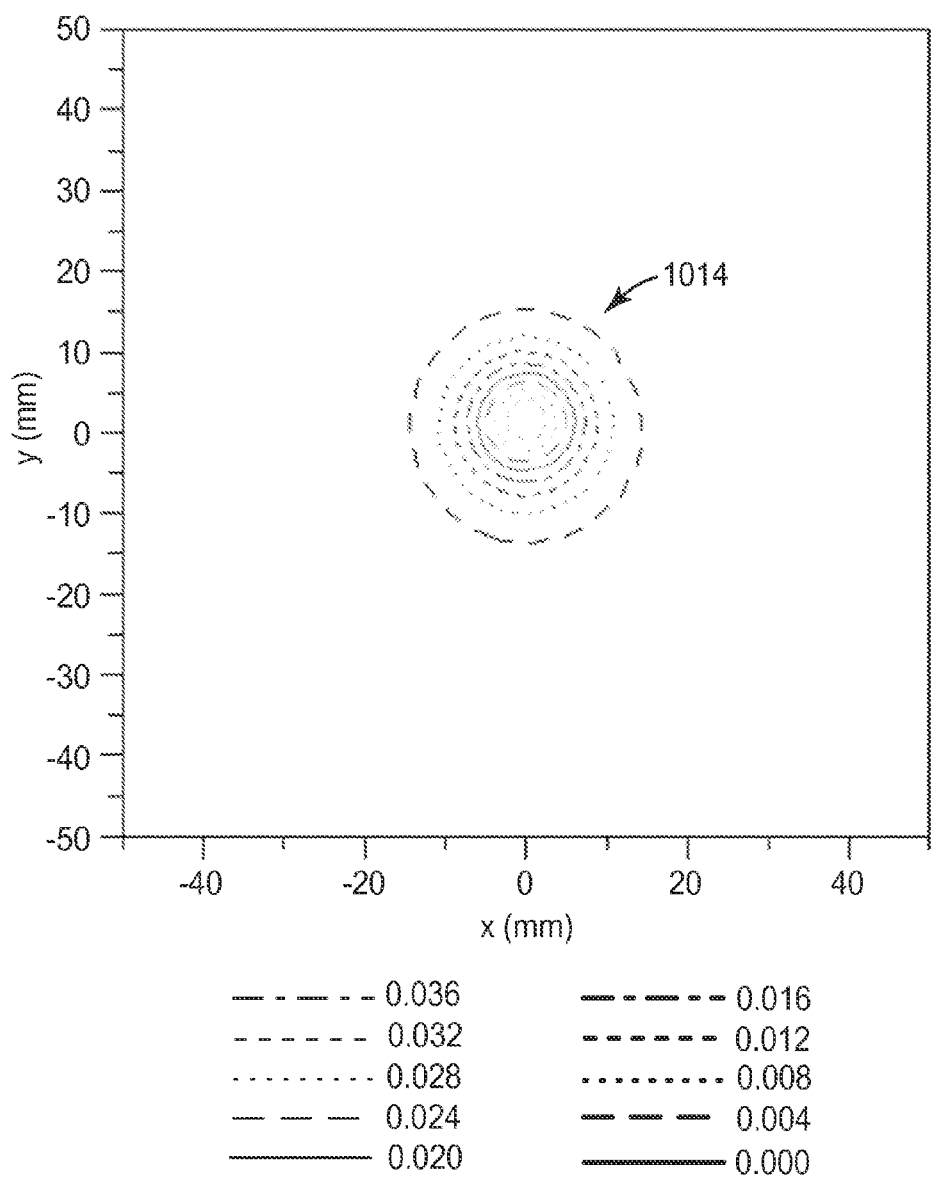

In a third energizing scheme, only two LEDs were energized, and the remaining LEDs remained "off". The energized LEDs were the ones at an intermediate radial distance from the optical axis, see e.g. LEDs 522a and 523a in FIG. 5. FIG. 10a shows the modeled spatial intensity of light observed at the lower observation plane, and FIG. 10b shows the modeled spatial intensity of light observed at the upper observation plane, just as in FIGS. 8a and 8b respectively. In the lower observation plane (FIG. 10a), we see an illumination area 1010 corresponding to the two energized LEDs, and we see another illumination area 1012 corresponding to phosphor light emitted as a result of the phosphor layer being excited by LED light reflected by the dichroic reflector. In the upper observation plane (FIG. 10b), we see a rotationally symmetric light spot 1014 emitted by the light source. The emitted light was broadband and nominally white, and its color was calculated to have a CIE x value of 0.377, and a CIE y value of 0.418. The correlated color temperature of this light was calculated to be 4399 K.

Figure 11A:
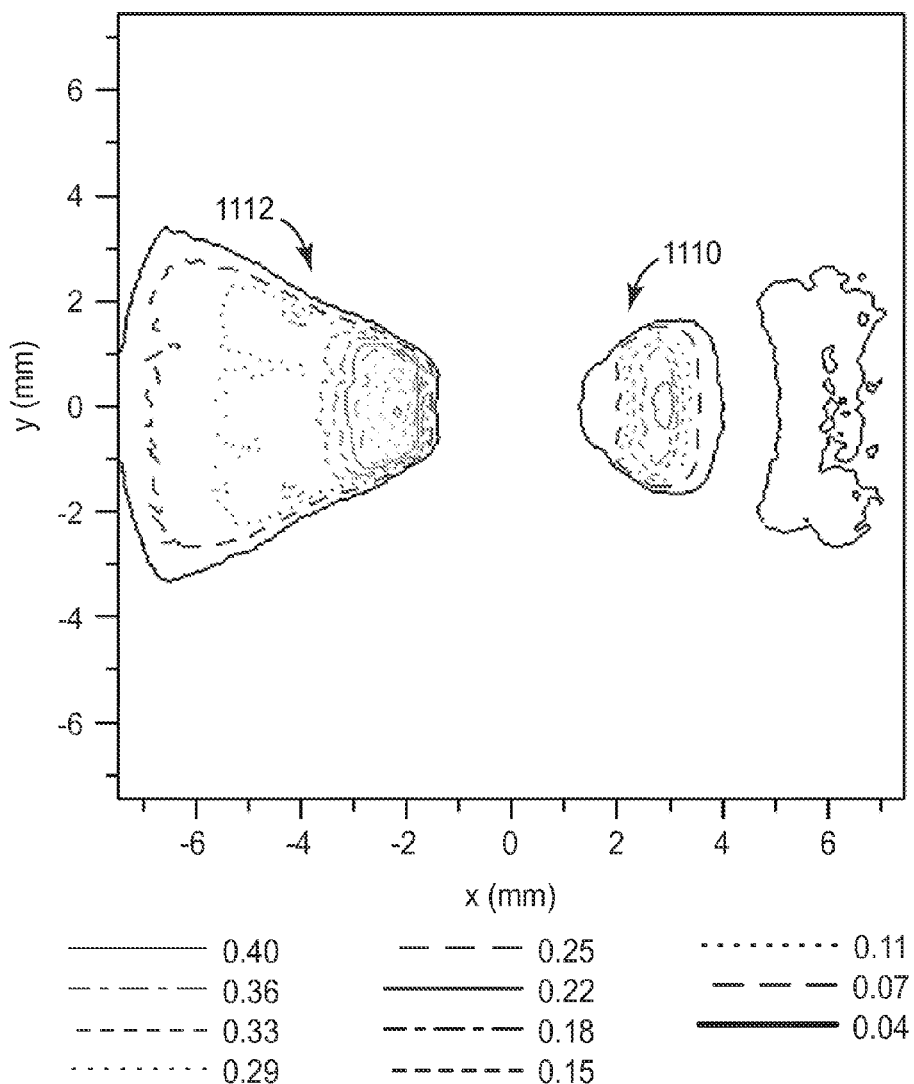
Figure 11B:
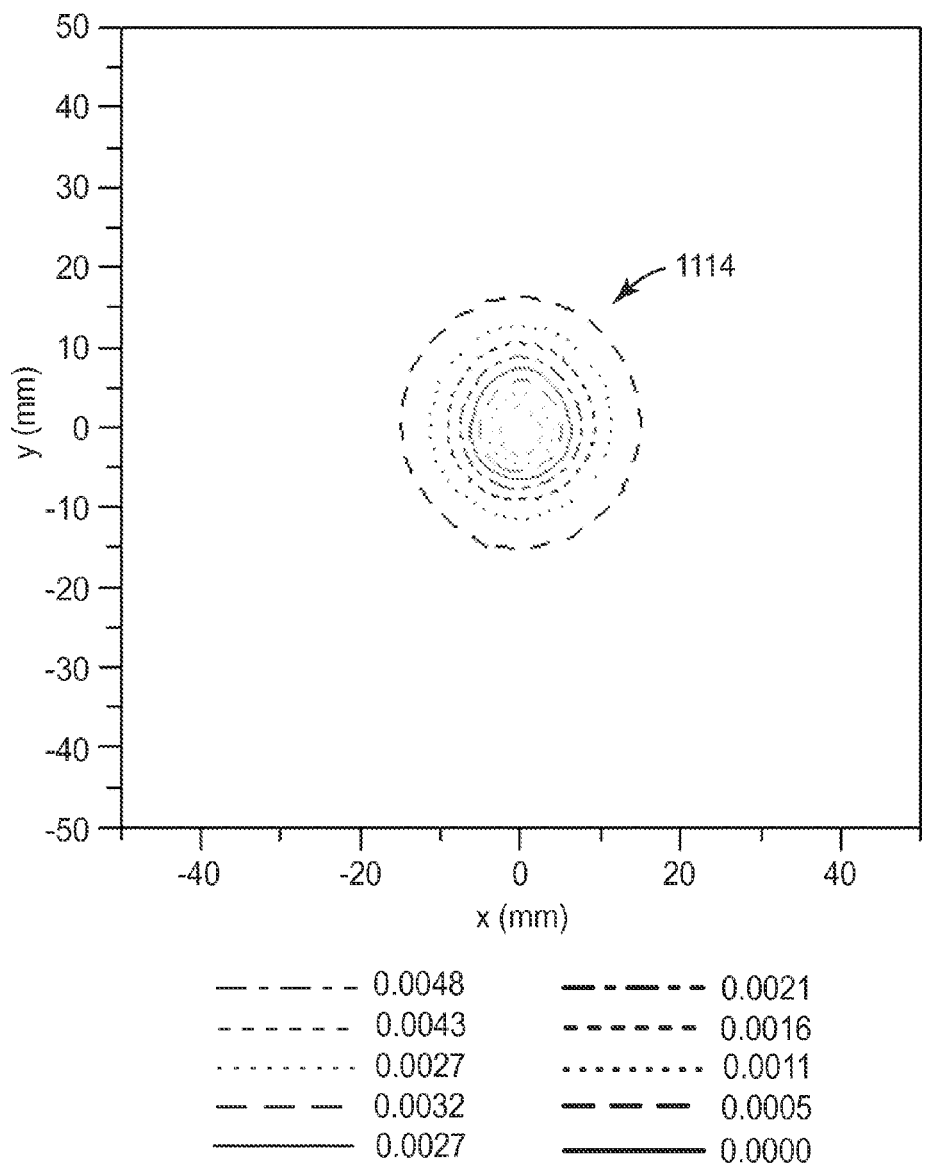

In a fourth energizing scheme, three LEDs were energized, and the remaining LEDs remained "off". The energized LEDs were the ones at the greatest radial distance from the optical axis, see e.g. LEDs 524a, 525a, and 526a in FIG. 5. FIG. 11a shows the modeled spatial intensity of light observed at the lower observation plane, and FIG. 11b shows the modeled spatial intensity of light observed at the upper observation plane, just as in FIGS. 8a and 8b respectively. In the lower observation plane (FIG. 11a), we see an illumination area 1110 corresponding to the three energized LEDs, and we see another illumination area 1112 corresponding to phosphor light emitted as a result of the phosphor layer being excited by LED light reflected by the dichroic reflector. In the upper observation plane (FIG. 11b), we see a rotationally symmetric light spot 1114 emitted by the light source. The emitted light was broadband and nominally white, and its color was calculated to have a CIE x value of 0.303, and a CIE y value of 0.289. The correlated color temperature of this light was calculated to be 8135 K.

Figure 12A:
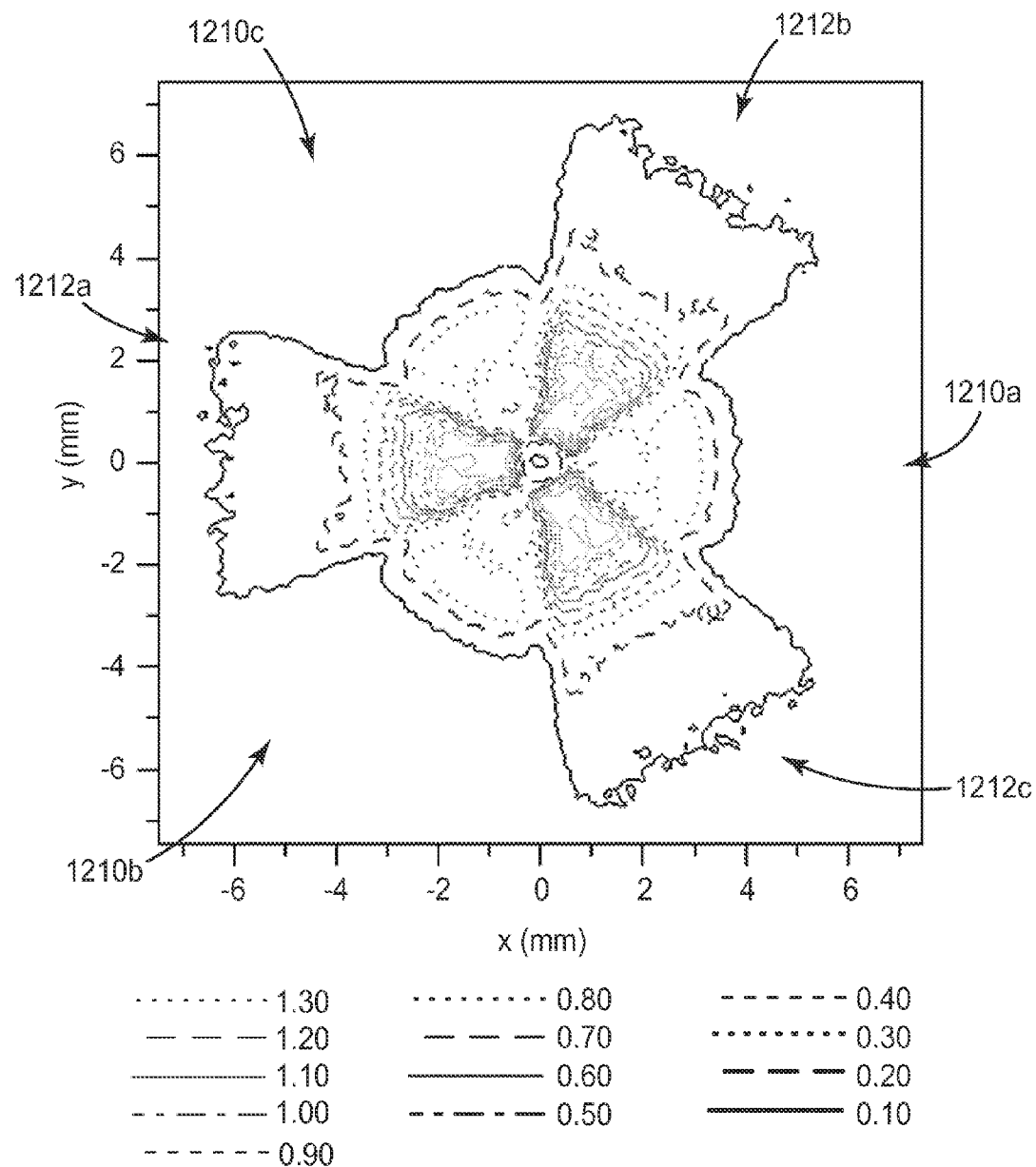
Figure 12B:
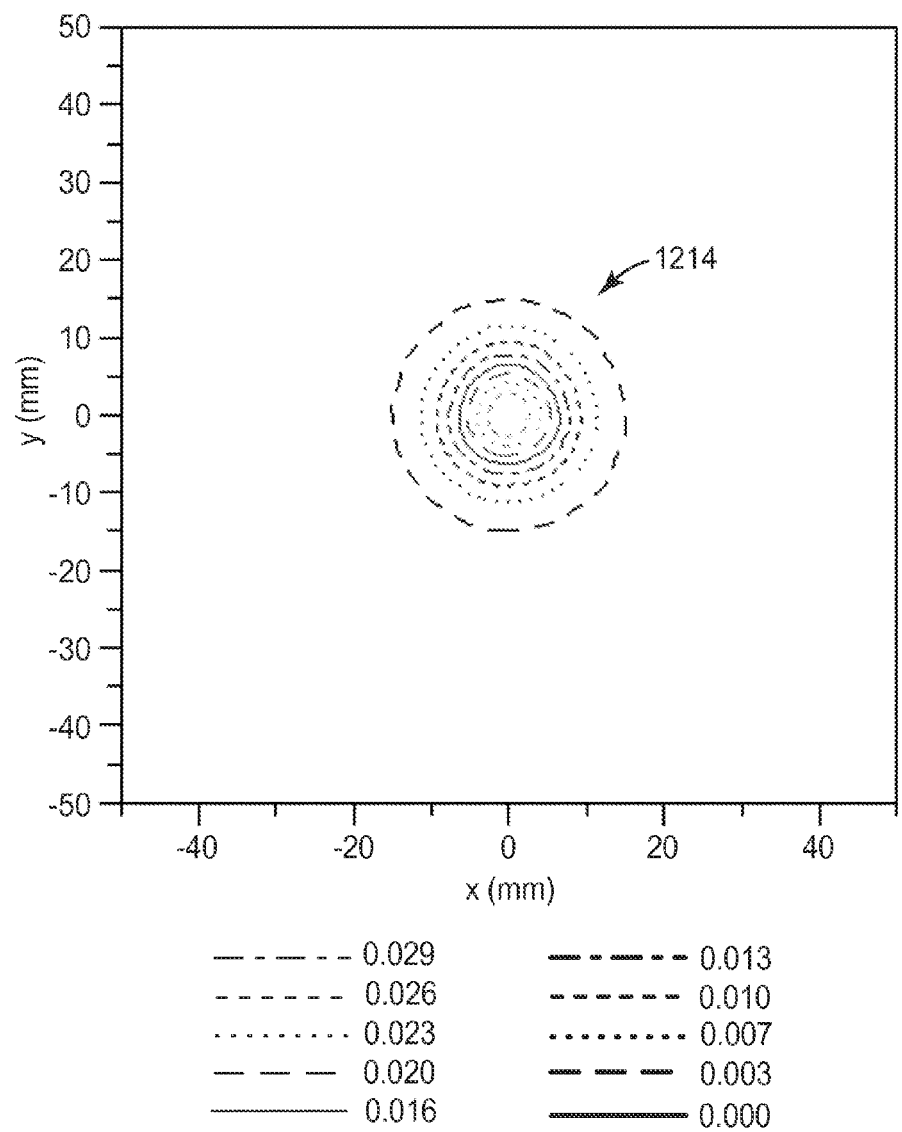

In a fifth energizing scheme, all eighteen LEDs were energized by equal amounts, and no LEDs remained "off". The energized LEDs corresponded to all of the LEDs depicted in FIG. 5. FIG. 12a shows the modeled spatial intensity of light observed at the lower observation plane, and FIG. 12b shows the modeled spatial intensity of light observed at the upper observation plane, just as in FIGS. 8a and 8b respectively. In the lower observation plane (FIG. 12a), we see three wedge-shaped illumination areas 1210a, 1210b, 1210c corresponding to the three wedge-shaped groups of neighboring LEDs (see LED groups 530, 532, and 534, respectively, in FIG. 5), and we see another three wedge-shaped illumination areas 1212a, 1212b, 1212c corresponding to phosphor light emitted as a result of the phosphor layer being excited by LED light reflected by the dichroic reflector from the respective LED groups. In the upper observation plane (FIG. 12b), we see a rotationally symmetric light spot 1214 emitted by the light source. The emitted light was broadband and nominally white, and its color was calculated to have a CIE x value of 0.341, and a CIE y value of 0.355. The correlated color temperature of this light was calculated to be 5292 K.

Figure 13A:
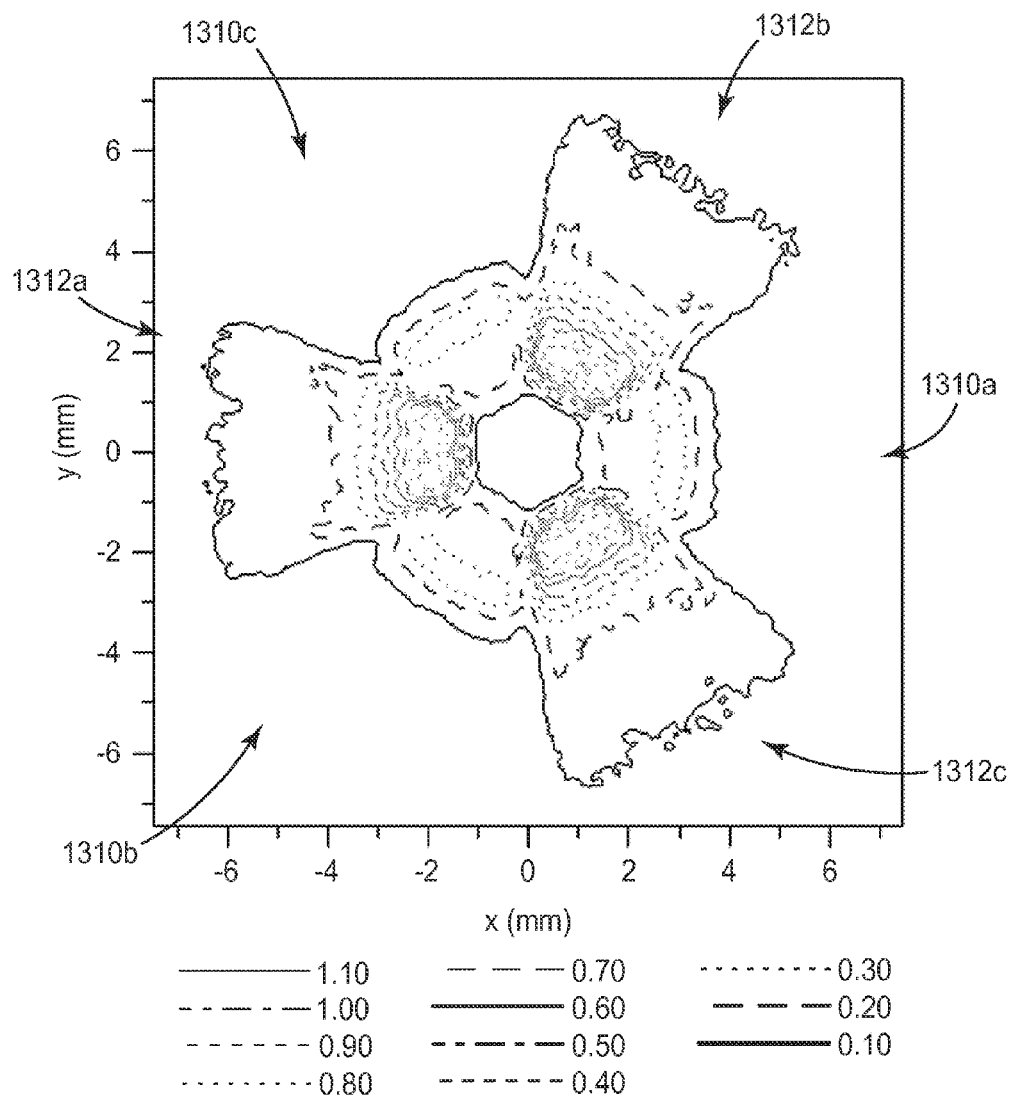
Figure 13B:
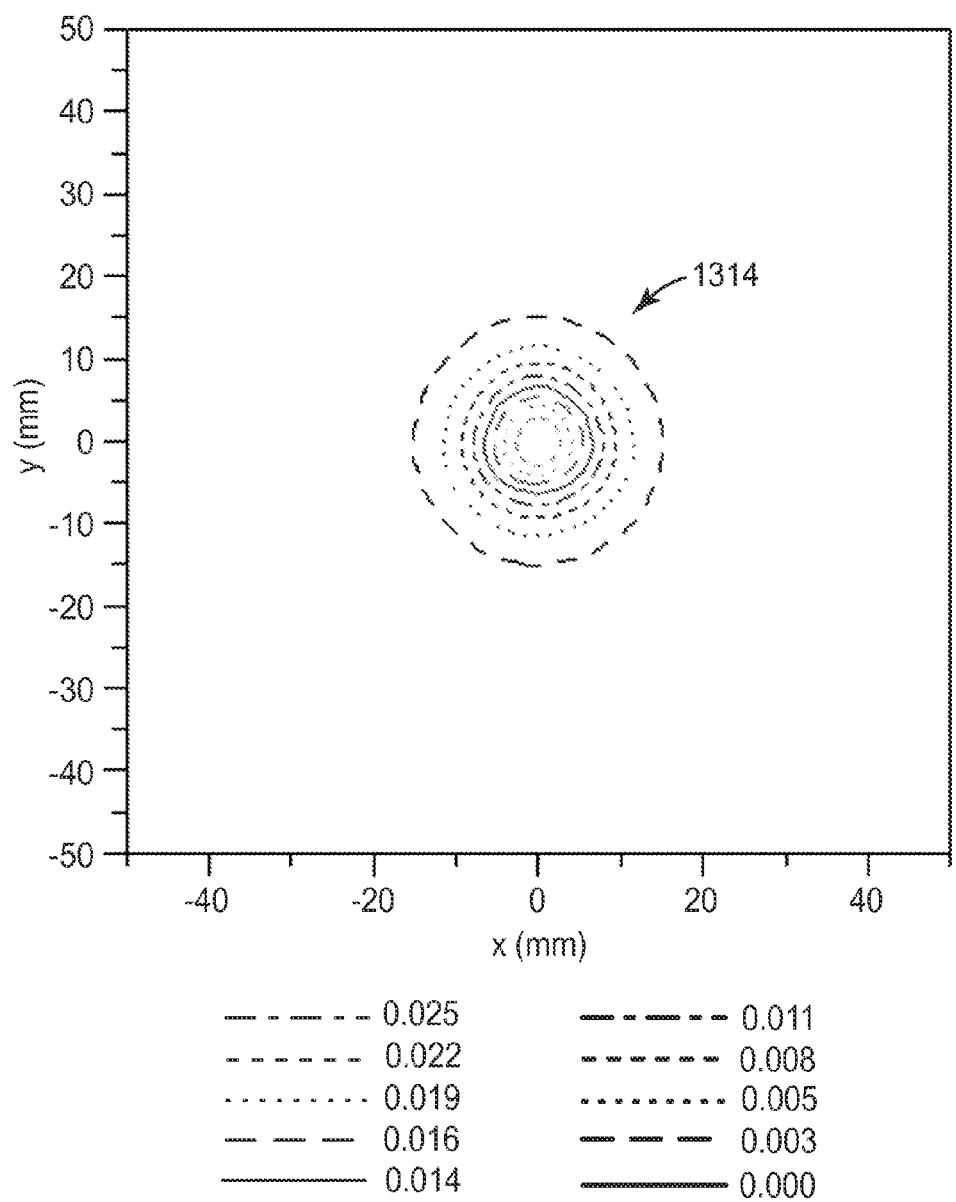

In a sixth energizing scheme, fifteen out of the eighteen LEDs were energized by equal amounts, and the remaining three LEDs remained "off". The LEDs that remained "off" were the one in each group of neighboring LEDs that was disposed closest to the optical axis, i.e., LEDs 521a, 521b, 521c in FIG. 5, with the remaining LEDs being energized. FIG. 13a shows the modeled spatial intensity of light observed at the lower observation plane, and FIG. 13b shows the modeled spatial intensity of light observed at the upper observation plane, just as in FIGS. 8a and 8b respectively. In the lower observation plane (FIG. 13a), three wedge-shaped illumination areas 1310a, 1310b, 1310c corresponding to the three wedge-shaped groups of neighboring LEDs (all but one of which was illuminated), and we see another three wedge-shaped illumination areas 1312a, 1312b, 1312c corresponding to phosphor light emitted as a result of the phosphor layer being excited by LED light reflected by the dichroic reflector from the respective partially energized LED groups. In the upper observation plane (FIG. 13b), we see a rotationally symmetric light spot 1314 emitted by the light source. The emitted light was broadband and nominally white, and its color was calculated to have a CIE x value of 0.332, and a CIE y value of 0.338. The correlated color temperature of this light was calculated to be 5720 K.

Figure 14A:
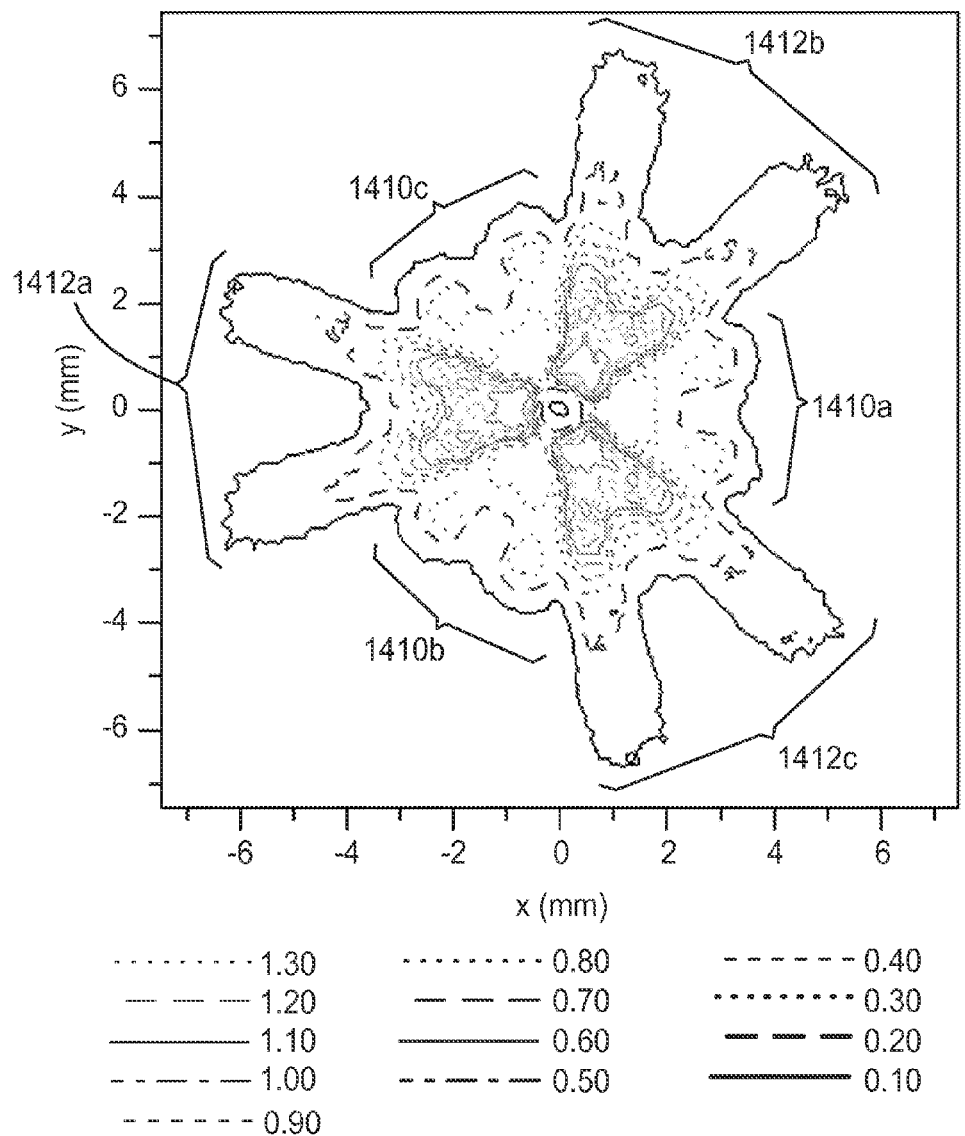
Figure 14B:
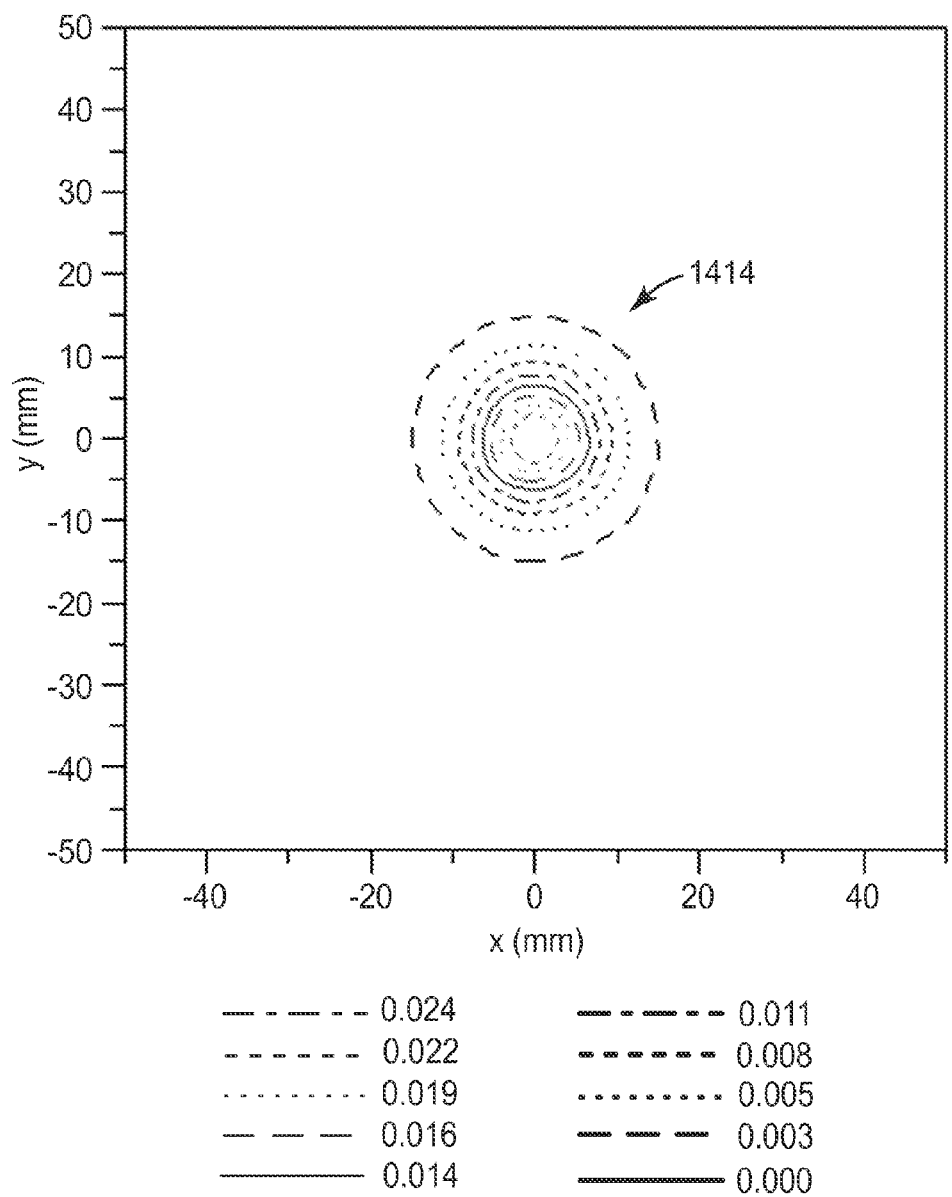

In a seventh energizing scheme, a different set of fifteen out of the eighteen LEDs were energized by equal amounts, with the remaining three LEDs remained "off". In this case, the LEDs that remained "off" were the one in each group of neighboring LEDs that was in the middle of the row of LEDs disposed farthest from the optical axis, i.e., LEDs 525a, 525b, 525c in FIG. 5, with the remaining LEDs being energized. The energized LEDs in each group of neighboring LEDs were thus arranged in a V-shaped pattern. FIG. 14a shows the modeled spatial intensity of light observed at the lower observation plane, and FIG. 14b shows the modeled spatial intensity of light observed at the upper observation plane, just as in FIGS. 8a and 8b respectively. In the lower observation plane (FIG. 14a), three V-shaped (or wedge-shaped) illumination areas 1410a, 1410b, 1410c corresponding to the three V-shaped groups of neighboring illuminated LEDs, and we see another three V-shaped illumination areas 1412a, 1412b, 1412c corresponding to phosphor light emitted as a result of the phosphor layer being excited by LED light reflected by the dichroic reflector from the respective partially energized LED groups. In the upper observation plane (FIG. 14b), we see a rotationally symmetric light spot 1414 emitted by the light source. The emitted light was broadband and nominally white, and its color was calculated to have a CIE x value of 0.347, and a CIE y value of 0.365. The correlated color temperature of this light was calculated to be 5096 K.

Figure 15:
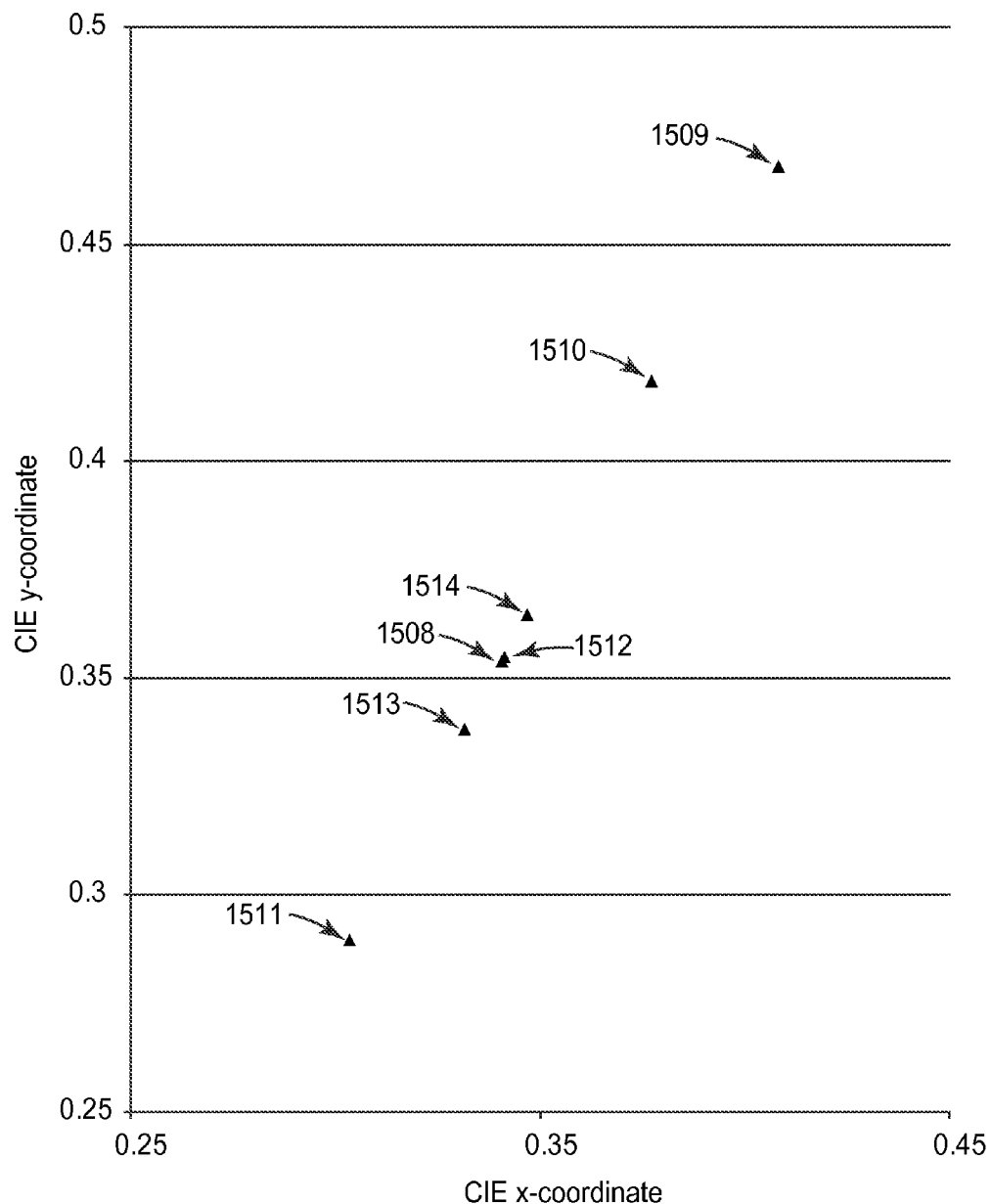
FIG. 15 is a graph of calculated color points for the seven different light source conditions associated with FIGS. 8 through 14, the color points plotted in CIE color chromaticity coordinates.

The CIE color chromaticity coordinates for the above-described broadband light source, for all seven of the above modeled energizing schemes, are plotted in the CIE chromaticity plot of FIG. 15. In this figure, color point 1508 is the color of the overall broadband light output of the source for the first energizing scheme, color point 1509 is the color for the second energizing scheme, color point 1510 is the color for the third energizing scheme, color point 1511 is the color for the fourth energizing scheme, color point 1512 is the color for the fifth energizing scheme, color point 1513 is the color for the sixth energizing scheme, and color point 1514 is the color for the seventh energizing scheme. The reader will observe that the color of the output light of the modeled broadband light source can be tuned or adjusted by selecting which LEDs to energize.

Consistent with the discussion above, numerous modifications can be made to the modeled broadband light source. For example, more or fewer than six LEDs can be used in each group of neighboring LEDs. The LEDs may be arranged in other patterns, whether in groups of neighboring LEDs or in dispersed or spaced-apart arrangements, or in combinations of neighboring and dispersed LEDs. The LEDs may be tailored or selected to have different emission spectra, rather than having the same emission spectra. For example, LEDs disposed closer to the center of the source (and/or closer to the optical axis of the dichroic reflector) may be selected to have a longer wavelength (e.g., blue light with a peak wavelength at 465 nm), and LEDs disposed farther from the center may be selected to have a shorter wavelength (e.g., blue light with a peak wavelength of 450 nm). The dichroic reflector may also be modified. For example, the normal incidence band edge may be shifted to longer or shorter wavelengths. Furthermore, rather than having the same optical properties over its entire working surface, the dichroic reflector may be made to have a variable thickness, e.g., slightly thinner at the center of the source (e.g. at the optical axis) and slightly thicker at the edges, or vice versa, such that it has somewhat different reflectance and transmission properties as a function of position; this design feature may be used to accentuate geometrical effects of the LEDs being at different radial distances from the optical axis, i.e., to increase the difference in color of broadband light portions associated with LEDs disposed near the center compared with that of LEDs disposed near the edge of the light source. In other variations, detectors can be added to provide feedback for a controller or to otherwise monitor the output of the light source. In one approach, the reflector 618 of FIG. 6 may be replaced with one or more detectors, e.g., silicon photodiode detectors formed on a silicon substrate, which detectors may then sense both phosphor light and LED light, if desired. Filters may also be provided on the front surface of such detectors. Filters of differing spectral transmission may be provided on different detectors, so that the filtered detectors have different effective spectral sensitivities, and so that a controller may combine the outputs of such detectors in such a way as to provide a real-time measure of the color or (correlated) color temperature of the output light of the source. Detectors of different inherent spectral sensitivity may also be used.

In further variations, one or more LEDs that do not significantly excite the phosphor layer may also be added to the broadband light source, e.g., to provide additional color adjustment. For example, a red, green, blue, or other color LED may be added to the surface 629 in FIG. 6, e.g., at the central point 629b. For example, one or more relatively long wavelength blue LEDs (e.g. having a peak wavelength of about 465 nm or more) may be placed at or near the central point of the light source, and may be positioned such that they do not significantly excite the phosphor layer but do significantly contribute to the overall output of the source, and one or more relatively shorter wavelength blue LEDs (e.g. having a peak wavelength of about 450 nm or less) may be positioned elsewhere such that they do significantly excite the phosphor layer.

Not only can the color output of the disclosed devices be affected by utilizing LEDs with different emission wavelengths, but the manufacturability of the package can also be improved. For example, it may be desirable to utilize some shorter wavelength blue LEDs, where the dichroic reflector may have close to 100% reflection at normal angles, and some longer wavelength blue LEDs, for which much or most of the light may be transmitted by the dichroic reflector. In some systems, we may wish to position one or more longer wavelength blue- or cyan-emitting LED at or near the center of the light source (a cyan or longer wavelength blue LED would also be desirable to increase the color rendering index (CRI) of the source), where transmission through the dichroic reflector may be very high, and position shorter wavelength blue LEDs (say 455 nm for the inner LEDs, and 440 nm for the outer LEDs, or 440 nm for all the phosphor LEDs) far from the center of the light source, e.g., at or near the edge of the light source. For example, the LED(s) near the center may have a peak wavelength of about 455 nm, and the LED(s) far from the center may have a peak wavelength of about 440 nm, or all phosphor LEDs may have a peak wavelength of about 440 nm. The LED(s) at or near the center may emit relatively long wavelength visible blue light, and the LED(s) farther from the center, which are configured to excite the phosphor layer, may emit longer wavelength blue light or UV light.

A reverse design approach may be desirable in other embodiments. That is, longer wavelength LEDs may be positioned farthest from the center of the light source, and shorter wavelength LEDs may be positioned near the center. An advantage of this approach is potentially higher efficiency due to improved imaging and dichroic performance for LEDs near the center, and to higher transmission of the dichroic reflector for LEDs at the outer positions. A potential disadvantage of the approach may be reduced uniformity, but that may be overcome by incorporated a diffuser into the light source, e.g., at a position that intercepts light after it has passed through the dichroic reflector, such as on a lens or as a separate optical element.

The technique of incorporating in a broadband light source one or more LEDs that do not excite the phosphor layer but that affect the color of the overall broadband output, and also incorporating one or more LEDs that do excite the phosphor layer, makes the dichroic reflector easier to design and manufacture, and can increase efficiency.

In other variations, the phosphor layer may be made to be discontinuous, such that one or more of the LEDs, or groups of LEDs, are mounted directly on a support substrate rather than on the phosphor, while maintaining the phosphor layer (e.g. in the form of isolated phosphor bodies) in areas that are highly illuminated by reflected LED light. Furthermore, the phosphor layer may be designed to have a different composition and/or structure at different positions.

Unless otherwise indicated, all numbers expressing feature sizes, amounts, physical properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application.

Various modifications and alterations of this invention will be apparent to those skilled in the art without departing from the scope and spirit of this invention, and it should be understood that this invention is not limited to the illustrative embodiments set forth herein. All U.S. patents, published and unpublished patent applications, and other patent and non-patent documents referred to herein are incorporated by reference, to the extent they do not directly contradict the foregoing disclosure.

The invention claimed is:

1. A light source for emitting broadband output light, comprising:
   a first and second LED adapted to emit first and second LED light respectively;
   a layer of phosphor material adapted to emit first longer wavelength phosphor light in response to excitation from light emitted by the first LED and second longer wavelength phosphor light in response to excitation from light emitted by the second LED; and
   a dichroic reflector configured to reflect at least a portion of the first LED light, and at least a portion of the second LED light, onto the layer of phosphor material in such a way that as light propagates from the first and second LEDs to the dichroic reflector it does not pass through the layer of phosphor material, the dichroic reflector substantially transmitting light at the first and second longer wavelengths so that such transmitted first and second longer wavelength phosphor light is included in the broadband output light of the light source;
   wherein the first longer wavelength phosphor light and optionally a remaining portion of the first LED light provide a first broadband light portion for the light source, and the second longer wavelength phosphor light and optionally a remaining portion of the second LED light provide a second broadband light portion for the light source, the broadband output light of the light source comprising the first and second broadband light portions; and
   wherein the first broadband light portion has a first color, and the second broadband light portion has a second color that differs from the first color.

2. The source of claim 1, wherein the first and second LEDs are disposed proximate a medium having a concave surface, and wherein the dichroic reflector is disposed on the concave surface.

3. The source of claim 2, wherein the concave surface is curved, and wherein a reflection spectrum of the dichroic reflector changes as a function of incidence angle of incident light.

4. The source of claim 1, wherein the first LED is one of a first group of LEDs, the LEDs in the first group providing, with longer wavelength phosphor light excited by such LEDs, first portions of the broadband output light of the light source, the first portions all having the first color.

5. The source of claim 4, wherein the dichroic reflector has an optical axis, and wherein the LEDs in the first group are each disposed at a same first distance from the optical axis.

6. The source of claim 5, wherein the second LED is one of a second group of LEDs, the LEDs in the second group providing, with longer wavelength phosphor light excited by such LEDs, second portions of the broadband output light of the light source, the second portions all having the second color, and wherein the LEDs in the second group are each disposed at a same second distance from the optical axis, the second distance being different from the first distance.

7. The source of claim 1, wherein the dichroic reflector reflects substantially all of the first and second LED light, such that the broadband output light of the light source includes substantially none of the first and second LED light;
   wherein the layer of phosphor material comprises a first phosphor layer portion and a second phosphor layer portion, the dichroic reflector configured to reflect at least a portion of the first LED light onto the first phosphor layer portion and to reflect at least a portion of the second LED light onto the second phosphor layer portion, the first and second phosphor layer portions having different phosphor compositions; and
   wherein the first and second phosphor layer portions emit phosphor light with differing spectral distributions when illuminated with the reflected light from the first and second LEDs respectively.

8. The source of claim 1, wherein the dichroic reflector reflects only a portion of the first and second LED light and transmits remaining portions of the first and second LED light, such that the broadband output light of the light source includes the remaining portions of the first and second LED light, wherein the dichroic reflector has a concave shape and an optical axis, and wherein the first and second LEDs are positioned at different radial distances from the optical axis.

9. The source of claim 8, wherein the first LED light impinges on the dichroic reflector over a first range of incidence angles, wherein the dichroic reflector has a first transmission spectrum having a first band edge characterized by a transition from low to high transmission over a first spectral transition region, wherein the first LED light has a first spectral distribution that at least overlaps with the first band edge, and wherein the first transmission spectrum corresponds to a first incidence angle that is disposed within the first range of incidence angles, wherein the second LED light impinges on the dichroic reflector over a second range of incidence angles, wherein the dichroic reflector has a second transmission spectrum having a second band edge characterized by a transition from low to high transmission over a second spectral transition region, wherein the second LED light has a second spectral distribution that at least overlaps with the second band edge, and wherein the second transmission spectrum corresponds to a second incidence angle that is disposed within the second range of incidence angles.

10. The source of claim 1, wherein the first and second LED lights have respective first and second peak wavelengths that differ by no more than 30 nm.

11. The source of claim 1, wherein the first and second LEDs are members of a first plurality of neighboring LEDs disposed in a first wedge-shaped region, and further comprising a second plurality of neighboring LEDs disposed in a second wedge-shaped region, the first and second wedge-shaped regions being separated from each other by an unobstructed portion of the layer of phosphor material.

12. The source of claim 11, further comprising a third plurality of neighboring LEDs disposed in a third wedge-shaped region separated from the first and second wedge-shaped regions, the third plurality of neighboring LEDs being disposed such that at least a portion of LED light from the third plurality of neighboring LEDs is reflected by the dichroic reflector onto the unobstructed portion of the layer of phosphor material.

13. The source of claim 1, further comprising:
   a controller configured to drive the first and second LEDs independently to control a color of the broadband output light; and
   one or more detectors positioned to receive at least a portion of at least one of the first LED light, the second LED light, the first longer wavelength phosphor light, and the second longer wavelength phosphor light;
   wherein the one or more detectors have one or more detector outputs respectively coupled to the controller, controller configured to drive the first and second LEDs as a function of the one or more detector outputs, and
   wherein the one or more detectors comprise a first detector having a first spectral response, and a second detector having a second spectral response different from the first spectral response, such that detector outputs of the first and second detectors can provide in combination an indication of color.

14. A light source for emitting broadband output light, comprising:
   a plurality of neighboring LEDs including a first and second LED adapted to emit first and second LED light, respectively;
   a light-transmissive structure in which the plurality of LEDs are encapsulated, the light-transmissive structure having a curved concave surface;
   a layer of phosphor material adapted to emit first longer wavelength phosphor light in response to excitation from light emitted by the first LED and second longer wavelength phosphor light in response to excitation from light emitted by the second LED; and
   a dichroic reflector that covers the curved concave surface and that is configured to reflect at least a portion of the first LED light, and at least a portion of the second LED light, onto the layer of phosphor material in such a way that as light propagates from the first and second LEDs to the dichroic reflector it does not pass through the layer of phosphor material, the dichroic reflector substantially transmitting light at the first and second longer wavelengths so that such transmitted first and second longer wavelength phosphor light is included in the broadband output light of the light source, the dichroic reflector having an optical axis;
   wherein the first and second LEDs are disposed at different radial distances from the optical axis;
   wherein the first longer wavelength phosphor light and optionally a remaining portion of the first LED light provide a first broadband light portion for the light source, and the second longer wavelength phosphor light and optionally a remaining portion of the second LED light provide a second broadband light portion for the light source, the broadband output light of the light source comprising the first and second broadband light portions; and
   wherein the first broadband light portion has a first color, and the second broadband light portion has a second color that differs from the first color.

15. A light source for emitting broadband output light, comprising:
   a first and second LED adapted to emit first and second LED light respectively, the first and second LED light both comprising blue light but having different spectral distributions;
   a layer of phosphor material adapted to emit first longer wavelength phosphor light in response to excitation from light emitted by the first LED; and
   a dichroic reflector configured to reflect at least a portion of the first LED light onto the layer of phosphor material in such a way that as light propagates from the first LED to the dichroic reflector it does not pass through the layer of phosphor material, the dichroic reflector substantially transmitting light at the first longer wavelength so that such transmitted first longer wavelength phosphor light is included in the broadband output light of the light source, the dichroic reflector also transmitting at least a portion of the second LED light;
   wherein the first longer wavelength phosphor light and optionally a remaining portion of the first LED light provide a first broadband light portion for the light source, the broadband output light of the light source comprising the first broadband light portion and the transmitted portion of the second LED light; and
   wherein the dichroic reflector has an optical axis, and wherein the second LED is disposed at a smaller radial distance from the optical axis than the first LED.

* * * * *

UNITED STATES PATENT AND TRADEMARK OFFICE
CERTIFICATE OF CORRECTION

| | | |
|---|---|---|
| PATENT NO. | : 9,159,885 B2 | Page 1 of 1 |
| APPLICATION NO. | : 13/991062 | |
| DATED | : October 13, 2015 | |
| INVENTOR(S) | : Ouderkirk et al. | |

It is certified that error appears in the above-identified patent and that said Letters Patent is hereby corrected as shown below:

Title Page, item (86)
Column 1
Line 1, Delete "PCT/US2011/165780" and insert -- PCT/US2011/065780 --, therefor.

Signed and Sealed this
Twelfth Day of July, 2016

Michelle K. Lee
*Director of the United States Patent and Trademark Office*